US010231350B2

(12) United States Patent
Katsuyama et al.

(10) Patent No.: US 10,231,350 B2
(45) Date of Patent: Mar. 12, 2019

(54) ELECTRONIC DEVICE

(71) Applicant: Panasonic Intellectual Property Management Co., Ltd., Osaka (JP)

(72) Inventors: Yusuke Katsuyama, Osaka (JP); Hitoshi Nakatani, Osaka (JP); Takeshi Mori, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/904,352

(22) Filed: Feb. 24, 2018

(65) Prior Publication Data

US 2018/0184533 A1 Jun. 28, 2018

Related U.S. Application Data

(63) Continuation of application No. PCT/JP2016/003573, filed on Aug. 3, 2016.

(30) Foreign Application Priority Data

Nov. 6, 2015 (JP) .................................. 2015-218857

(51) Int. Cl.
*G06F 1/16* (2006.01)
*H05K 5/02* (2006.01)
*G06F 1/18* (2006.01)

(52) U.S. Cl.
CPC ............. *H05K 5/0221* (2013.01); *G06F 1/16* (2013.01); *G06F 1/1667* (2013.01);
(Continued)

(58) Field of Classification Search
CPC .............................. G06F 1/1632; G06F 1/1654
(Continued)

(56) References Cited

U.S. PATENT DOCUMENTS 8,817,456 B2 * 8/2014 Lin ........................ G06F 1/1669
361/679.29
8,922,994 B2 * 12/2014 Zawacki ............... G06F 1/1683
292/30

(Continued)

FOREIGN PATENT DOCUMENTS

JP 2014-099007 5/2014

OTHER PUBLICATIONS

International Search Report for corresponding PCT/JP2016/003573, dated Oct. 11, 2016.

*Primary Examiner* — Anthony Q Edwards
(74) *Attorney, Agent, or Firm* — Renner Otto Boisselle & Sklar, LLP

(57) ABSTRACT

A drive mechanism has an engaging member that abuts on a first engageable part and moves to a first axial center direction position and an engaging member that abuts on a second engageable part and moves to the first axial center direction position, when a first unit is mounted on a second unit. When an operating member is located at a second position, in a case where the right and left engaging members are moved to the first axial center direction positions, the operating member is moved from the second position to the first position. In a case where at least one of the right and left engaging members is not moved to the first axial center direction position, the operating member is not moved from the second position to the first position.

10 Claims, 34 Drawing Sheets

(52) U.S. Cl.
CPC .............. *G06F 1/1679* (2013.01); *G06F 1/18* (2013.01); *H05K 5/0247* (2013.01)

(58) Field of Classification Search
USPC ........................................ 361/679.41, 679.43
See application file for complete search history.

(56) References Cited

U.S. PATENT DOCUMENTS

| | | | | |
|---|---|---|---|---|
| 9,195,274 | B2* | 11/2015 | Chen | G06F 1/1681 |
| 9,575,513 | B2* | 2/2017 | Nishioka | G06F 1/1669 |
| 2005/0168925 | A1* | 8/2005 | Fang | G06F 1/1626 |
| | | | | 361/679.07 |
| 2013/0259564 | A1* | 10/2013 | Lin | H01R 13/42 |
| | | | | 403/327 |
| 2014/0355196 | A1* | 12/2014 | Hashimoto | G06F 1/1632 |
| | | | | 361/679.27 |
| 2014/0355210 | A1* | 12/2014 | Hashimoto | G06F 1/1679 |
| | | | | 361/679.58 |
| 2016/0062402 | A1* | 3/2016 | Matsumoto | G06F 1/1632 |
| | | | | 361/679.43 |

* cited by examiner

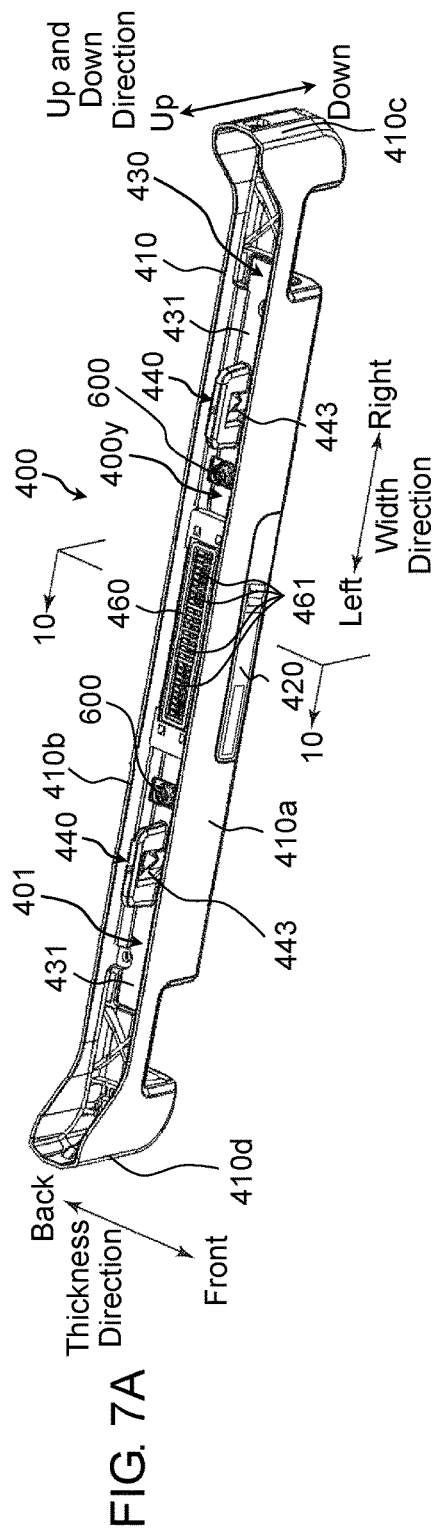
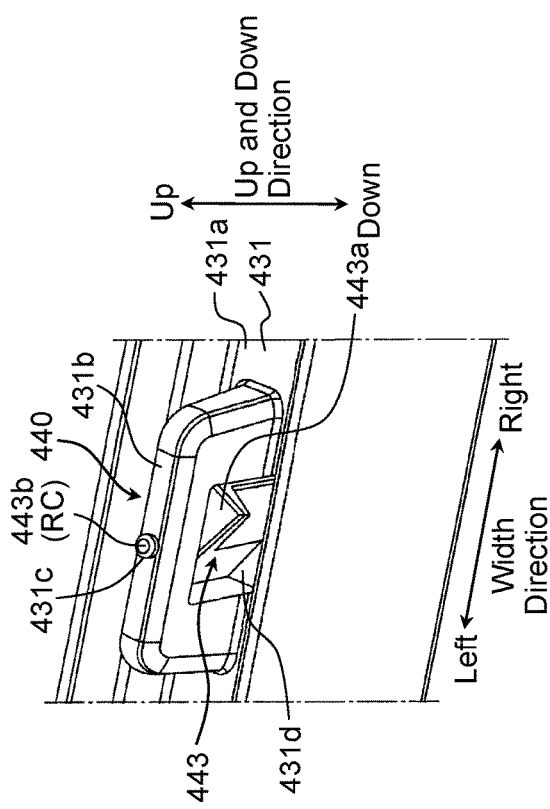
FIG. 7A
FIG. 7B

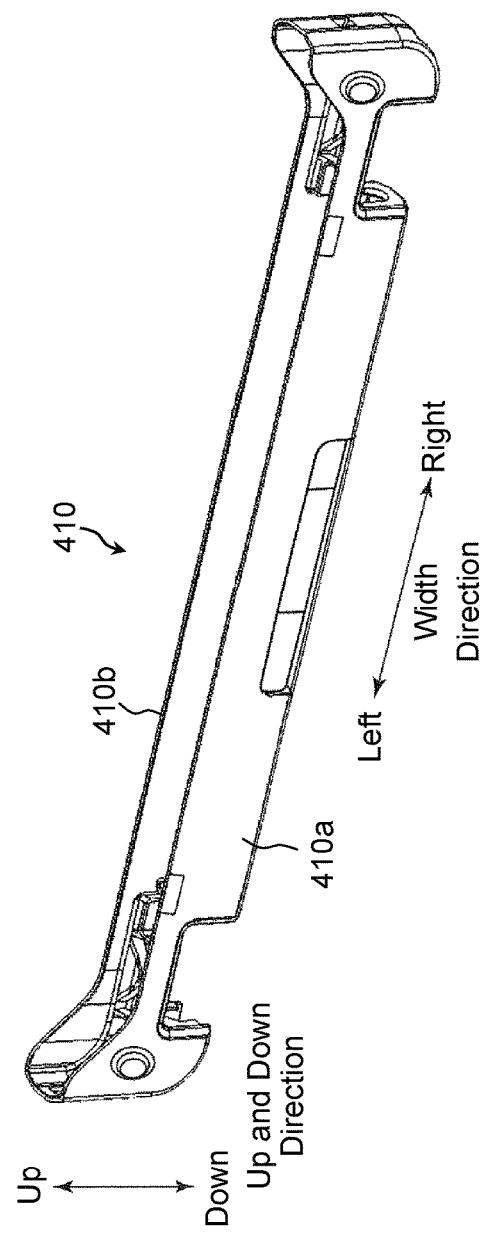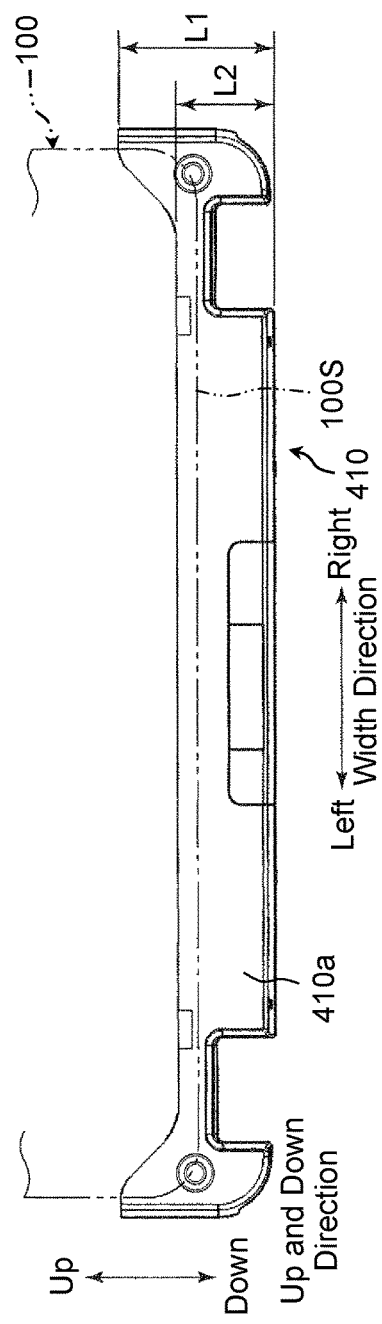
FIG. 9A
FIG. 9B

Front ←——→ Back
Thickness Direction

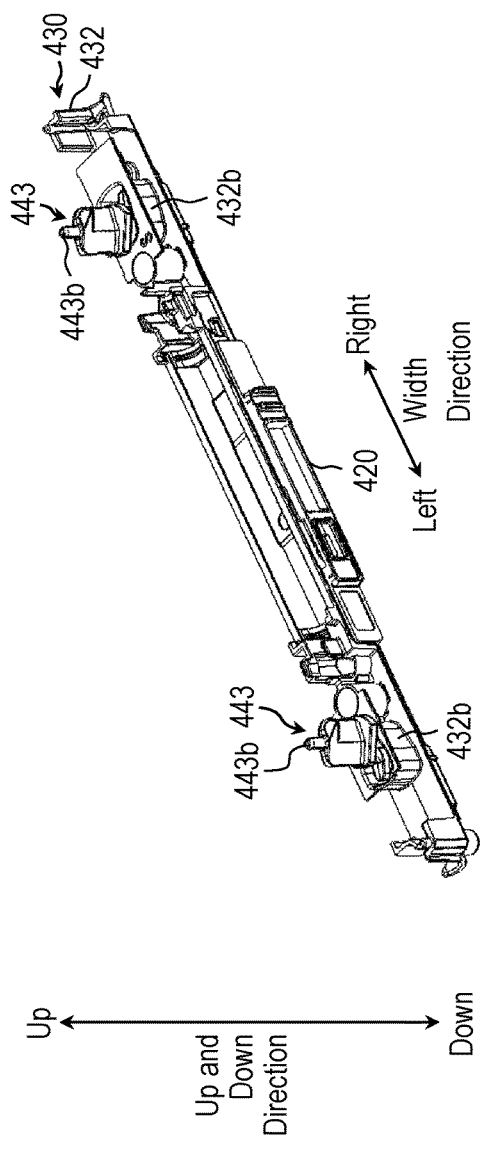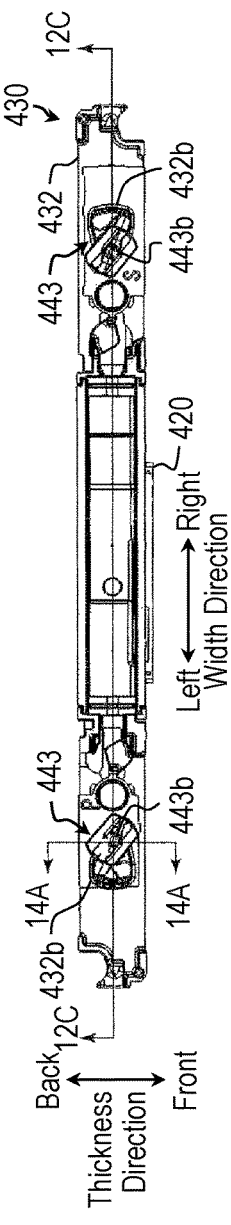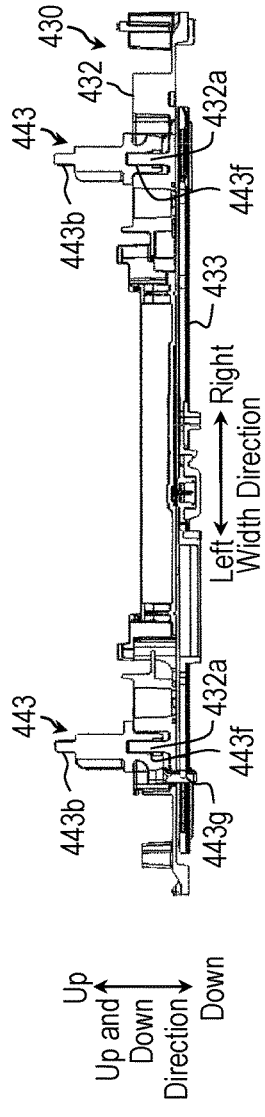

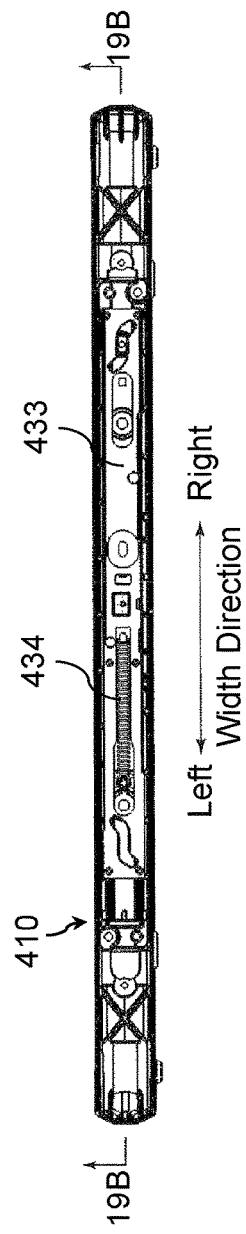
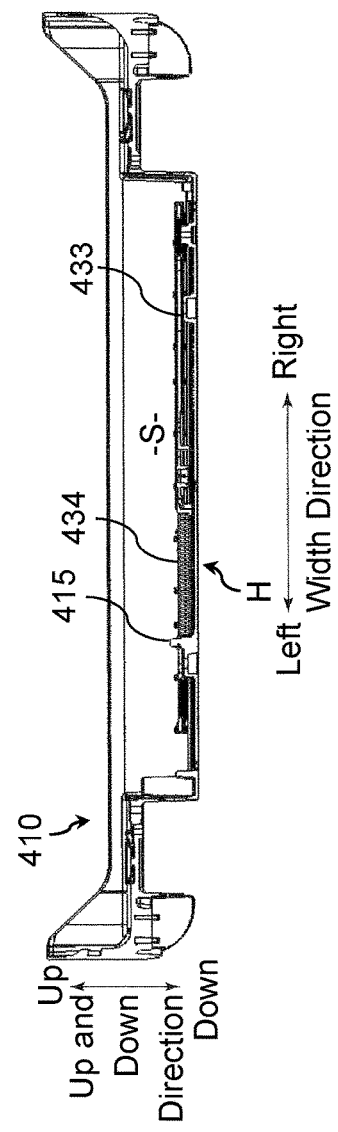

Front ←——→ Back
Thickness Direction

Front ←——→ Back
Thickness Direction

ELECTRONIC DEVICE

BACKGROUND

1. Technical Field

The present disclosure relates to an electronic device including a first unit and a second unit, and being constructed such that the first unit and the second unit are detachable, the electronic device having a lock mechanism capable of locking the first unit and the second unit in a coupled state.

2. Description of the Related Art

PTL 1 discloses an electronic device having a detachable mechanism (a lock mechanism) that is capable of locking a tablet type computer (a first unit) and a station with a keyboard (a second unit) in a coupled state.

CITATION LIST

Patent Literature

PTL 1: Unexamined Japanese Patent Publication No. 2014-99007

SUMMARY

The present disclosure provides an electronic device capable of causing a user to recognize that a first unit is not properly coupled to a second unit.

An electronic device of the present disclosure is an electronic device including a first unit having a first electronic member and a second unit having a second electronic member, and being constructed such that the first unit and the second unit are detachable. The first unit has a first engageable part and a second engageable part provided separately. The second unit has a lock mechanism capable of locking the first unit in an state where the first unit is attached to the second unit. The lock mechanism includes an operating member, a first engaging member, a second engaging member, and a drive mechanism. The operating member is movable between a first position and a second position. The first engaging member is engageable with the first engageable part and is movable to a first predetermined position. The second engaging member is engageable with the second engageable part and is movable to a second predetermined position. The drive mechanism engages the first engaging member and the first engageable part and the second engaging member and the second engageable part when the operating member is located at the first position. The drive mechanism releases engagement between the first engaging member and the first engageable part and engagement between the second engaging member and the second engageable part when the operating member is located at the second position. When the operating member is located at the second position, in a case where the first engaging member is moved to the first predetermined position and the second engaging member is moved to the second predetermined position, the drive mechanism moves the operating member from the second position to the first position. In a case where at least one of the first engaging member and the second engaging member is not moved to the first predetermined position or to the second predetermined position, the drive mechanism does not move the operating member from the second position to the first position.

According to the present disclosure, when the first unit is attached to the second unit while the operating member is located at the second position, in a case where the first engaging member is moved to the first predetermined position and the second engaging member is moved to the second predetermined position, the operating member is moved from the second position to the first position. In a case where at least one of the first engaging member and the second engaging member is not moved to the first predetermined position or to the second predetermined position, the operating member is not moved from the second position to the first position. Therefore, the user can visually recognize that the first unit is not locked to the second unit based on a fact that the operating member is not moved toward the first position. As a result, it is expected that the user would appropriately attach the first unit to the second unit. With this configuration, the electronic device is prevented from being carried while the first unit and the second unit are insufficiently locked.

BRIEF DESCRIPTION OF THE DRAWINGS

FIG. 7A is a perspective view of a socket of the second unit included in the electronic device according to the present exemplary embodiment (a state in which an engaging member is located at a first rotational position);

FIG. 7B is an enlarged perspective view of the engaging member of the socket of the second unit included in the electronic device according to the present exemplary embodiment (the state in which the engaging member is located at the first rotational position);

FIG. 9A is a perspective view of a socket body of the electronic device according to the present exemplary embodiment;

FIG. 9B is a side view of the socket body of the electronic device according to the present exemplary embodiment;

FIG. 12A is a perspective view of the socket side components of the lock mechanism components included in the electronic device according to the present exemplary embodiment (the state in which the engaging member is located at the first rotational position);

FIG. 12B is a plan view of the socket side components of the lock mechanism components included in the electronic device according to the present exemplary embodiment (the state in which the engaging member is located at the first rotational position);

FIG. 12C is a sectional view taken along line 12C-12C in FIG. 12B;

FIG. 19A is a plan view of the socket body, the coupling member, and the spring that configure the lock mechanism of the electronic device according to the present exemplary embodiment (the state in which the operating member is located at the first position);

FIG. 19B is a sectional view taken along line 19B-19B in FIG. 19A;

DETAILED DESCRIPTION

Hereinafter, exemplary embodiments are described in detail with reference to the drawings as appropriate. However, detailed description beyond necessity may be omitted. For example, detailed description of a matter that has been already known well or overlapping description of substantially the same configuration may be omitted. This is to avoid unnecessary redundancy of the following description and to facilitate understanding by those skilled in the art.

Note that the inventor of the present disclosure provides the attached drawings and the following description for those skilled in the art to fully understand the present disclosure, and do not intend to limit the subject matter as described in the appended claims by these drawings and description.

First Exemplary Embodiment

Hereinafter, a first exemplary embodiment is described with reference to the drawings.

[1. Configuration]

[1-1. Summary of Electronic Device]

Figure 1:
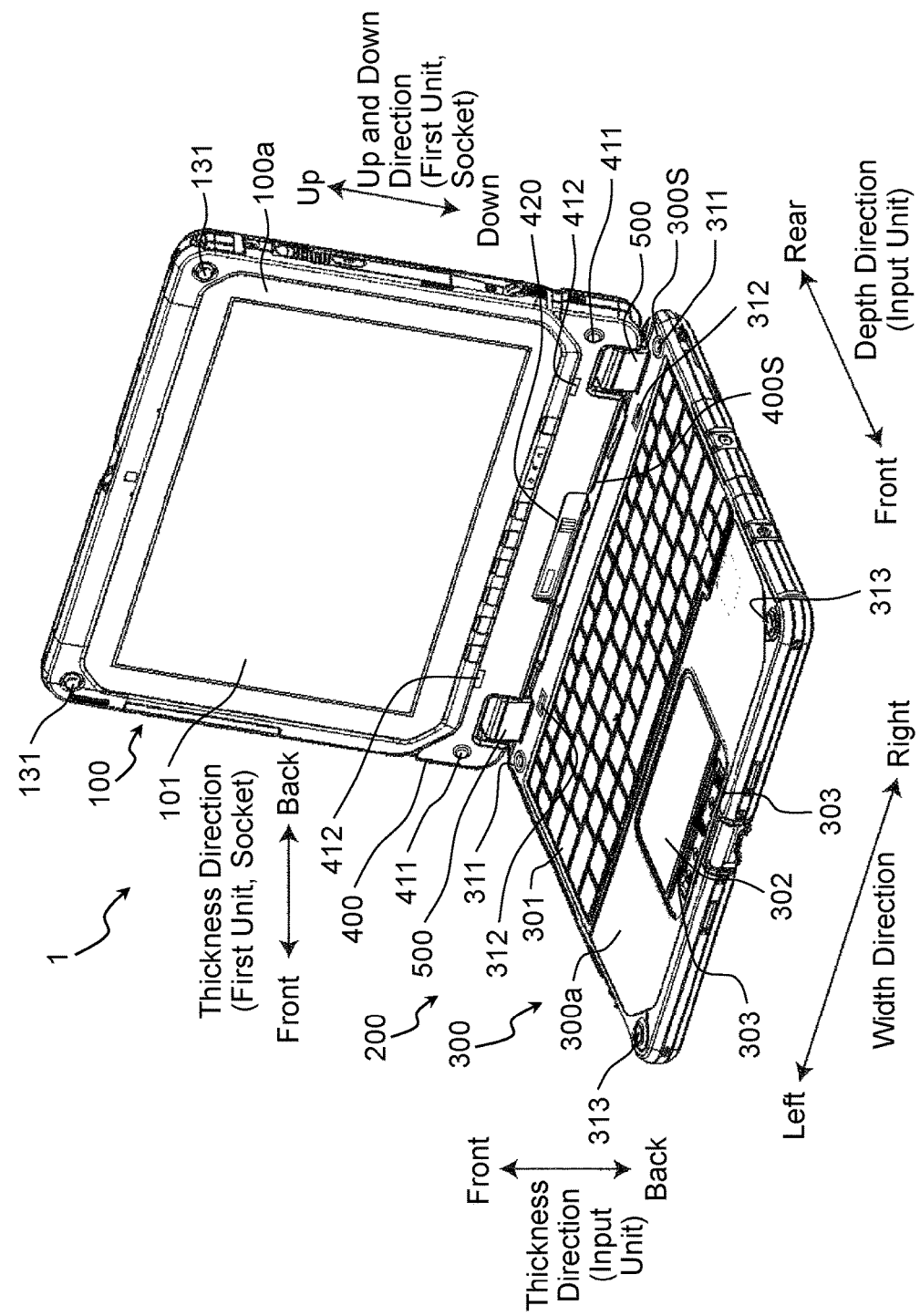
FIG. 1 is a perspective view of a front side of an electronic device according to a present exemplary embodiment.
Figure 2A:
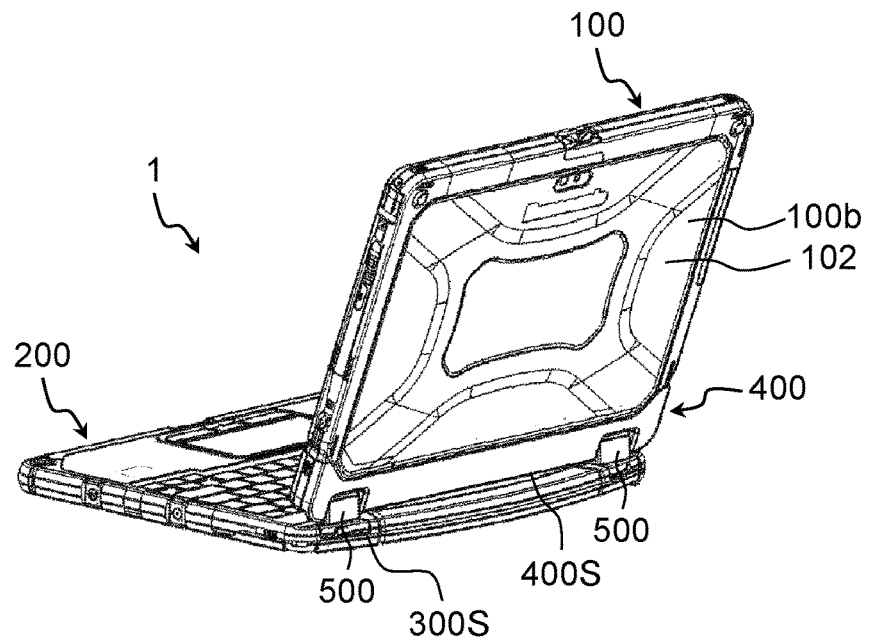
FIG. 2A is a perspective view of a back side of the electronic device according to the present exemplary embodiment.
Figure 2B:
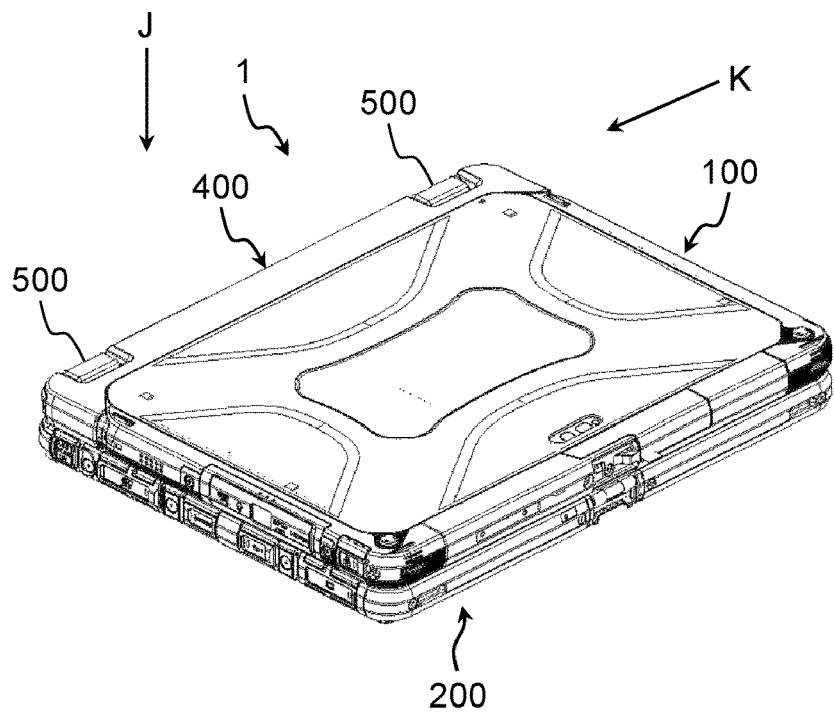
FIG. 2B is a perspective view showing a state in which a first unit and a second unit of the electronic device according to the present exemplary embodiment are closed.

FIG. 1 is a perspective view of a front side of electronic device 1 according to the present exemplary embodiment. FIG. 1 shows an external appearance of a state in which electronic device 1 is opened. FIG. 2A is a perspective view of a back side of electronic device 1 according to the present exemplary embodiment. FIG. 2B is a perspective view showing a state in which first unit 100 and second unit 200 of electronic device 1 according to the present exemplary embodiment are closed. It should be noted that a definition of a direction of each device, unit, or the like is described in FIG. 1 or the like. Width directions of electronic device 1, first unit 100, second unit 200, input unit 300, and socket 400 are identical, and may be simply referred to as the "width direction" hereinafter. It should be noted that a rotating axial center direction of hinge 500 is parallel to the width direction in the present exemplary embodiment. A definition of a direction of a unit to be explained is described in the respective drawings other than FIG. 1. It should be noted that the definition is for convenience of explanation to facilitate understanding. An absolute arrangement condition and a direction of a component when the component is used are not defined.

Figure 3A:
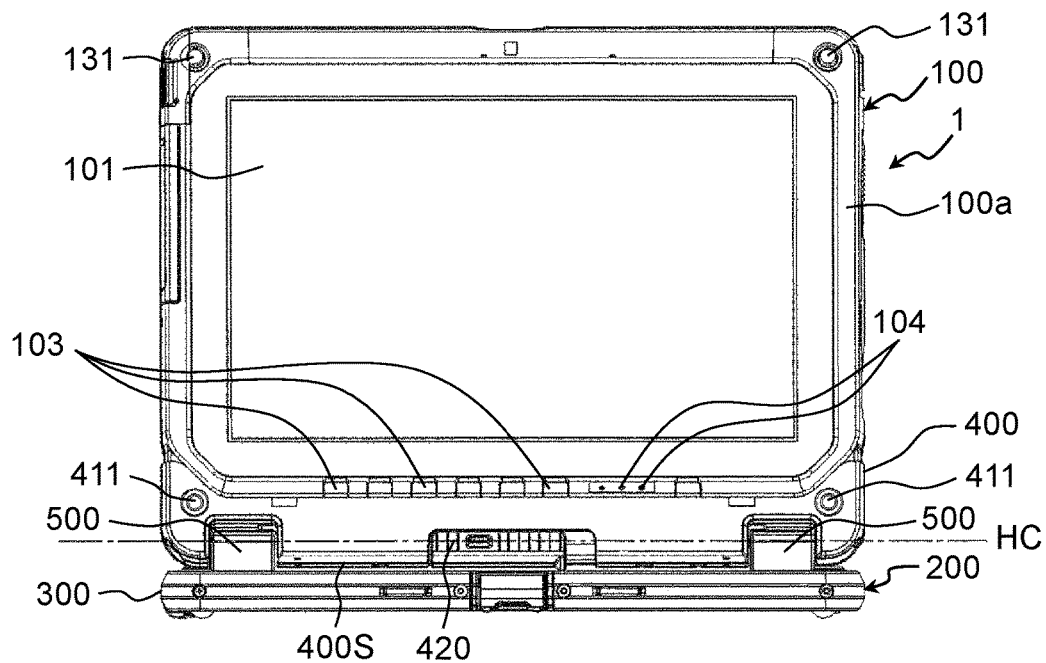
FIG. 3A is a front view of the electronic device according to the present exemplary embodiment (a state in which the first unit is fitted to the second unit)
Figure 3B:
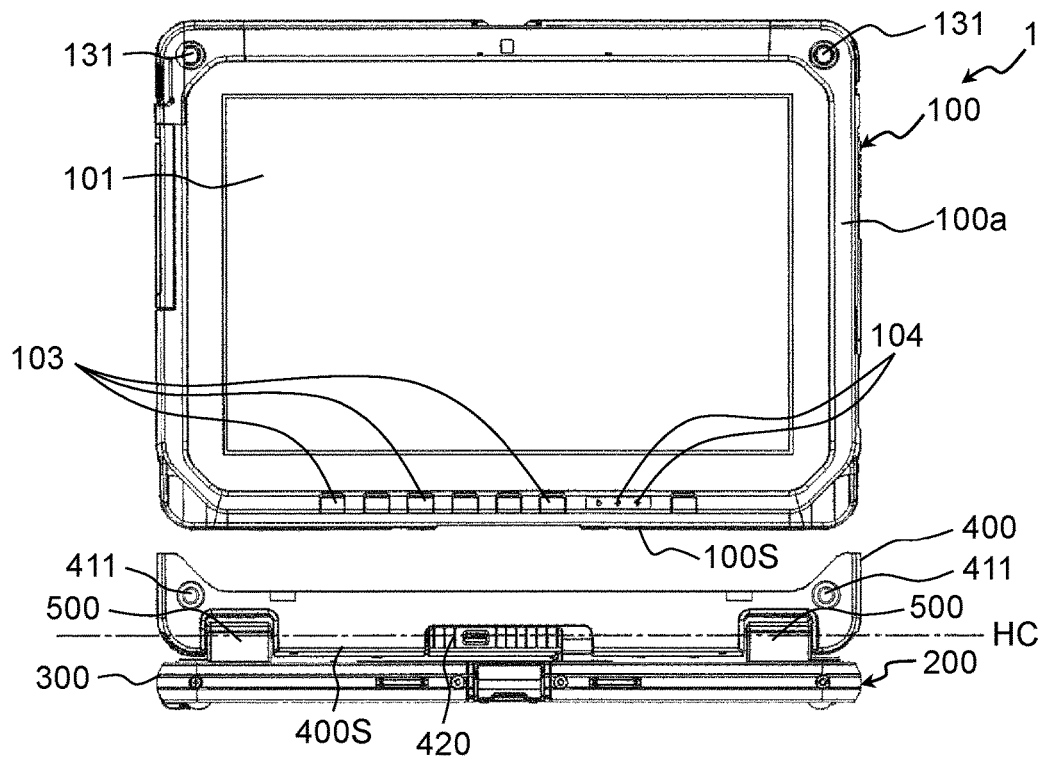
FIG. 3B is a front view of the electronic device according to the present exemplary embodiment (a state in which the first unit is detached from the second unit)

As shown in FIG. 1, electronic device 1 includes first unit 100 (a tablet type computer), and second unit 200 (a unit having keyboard 301 and the like). First unit 100 and second unit 200 are detachable. With this configuration, electronic device 1 is constituted as a so-called detachable type computer. FIGS. 3A and 3B are front views of electronic device 1 according to the present exemplary embodiment. Specifically, FIG. 3A shows a state in which first unit 100 is attached to second unit 200, and FIG. 3B shows a state in which first unit 100 is detached from second unit 200.

As shown in FIGS. 1 to 3B, first unit 100 is the tablet type computer. First unit 100 has display 101 on first principal surface 100a (a surface on a front side in a thickness direction). Display 101 is, for example, a liquid crystal display panel. Further, display 101 is a touch panel capable of receiving touch operation by a user. First unit 100 incorporates a central processing unit (CPU), a volatile storage (RAM), a nonvolatile storage (ROM, SSD, or the like), a battery, and the like. Second principal surface 100b (a surface on a back side in the thickness direction) has detachable cover 102. The nonvolatile storage (ROM, SSD, or the like) stores an operating system (OS), various application programs, various data, and the like. The central processing unit (CPU) executes arithmetic processing by reading the OS, the application programs, and the various data, thereby realizing various functions.

Second unit 200 includes an input part through which the user can perform input processing. First unit 100 is detachable from second unit 200. Second unit 200 includes input unit 300, socket 400, and hinge 500.

A casing of input unit 300 is formed of metal such as magnesium alloy, or resin. The input part including keyboard 301, touch pad 302, a plurality of operation buttons 303, and the like is provided on principal surface 300a of input unit 300 (a surface on the front side in the thickness direction).

Socket 400 is capable of housing side 100S on a lower side in an up and down direction of first unit 100 (a predetermined side of the first unit, and hereinafter appropriately referred to as "lower side 100S").

Hinge 500 couples side 300S on a rear side in a depth direction of input unit 300 (a predetermined side of the input unit, and hereinafter appropriately referred to as "rear side 300S") to side 400S on a lower side in an up and down direction of socket 400 (a predetermined side of the socket, and hereinafter appropriately referred to as "lower side 400S"), such that input unit 300 and socket 400 are relatively rotatable. Hinge 500 has rotating axial center HC parallel to the width direction of electronic device 1. For example, as shown in FIGS. 1 and 2A, hinge 500 can hold first unit 100 and second unit 200 in a state in which first unit 100 and second unit 200 are opened at an angle of, for example, about 100 degrees. Further, hinge 500 can make first unit 100 in a closed state with respect to second unit 200 (a state in which first principal surface 100a of first unit 100 and principal surface 300a of input unit 300 of second unit 200 are closely opposed and substantially parallel to each other).

Socket 400 is provided with connector 460 (see FIG. 7A) to be connected with connector 120 (see FIG. 4) of first unit 100 in a state in which lower side 100S of first unit 100 is housed. Various signals and electric power are given and received between first unit 100 and second unit 200 via connector 120 and connector 460. For example, signals output from the input part including keyboard 301, touch pad 302, the plurality of operation buttons 303, and the like, of input unit 300 of second unit 200 can be output to first unit 100. First unit 100 can receive these signals and perform control based on the received signals. Therefore, electronic device 1 can be utilized as a notebook type computer by attaching first unit 100 to second unit 200. Further, first unit 100 can be utilized alone as a tablet type computer.

[1-2. Configuration of Lock Mechanism]

Electronic device 1 of the present exemplary embodiment has a lock mechanism for preventing detachment of first unit 100 from second unit 200 in a state in which first unit 100 is attached to second unit 200 (a coupled state). In other words, electronic device 1 has the lock mechanism capable of locking first unit 100 and second unit 200 in the coupled state. The lock mechanism is described below in detail.

[1-2-1. Configuration of Lock Mechanism Components on First Unit Side]

Figure 4:
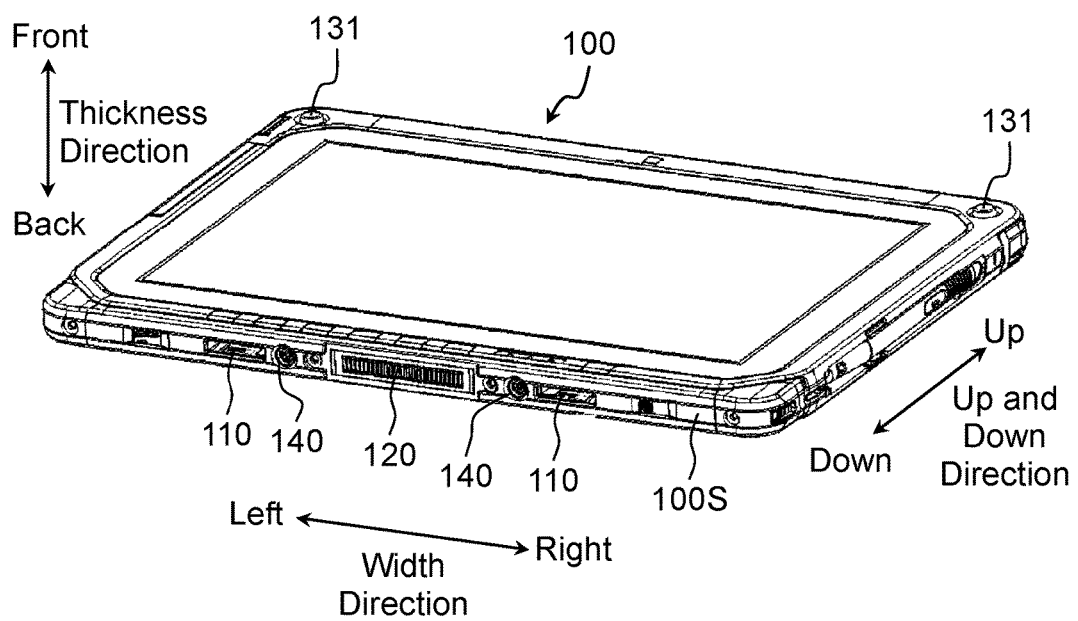
FIG. 4 is a perspective view of the first unit (a tablet type computer) of the electronic device according to the present exemplary embodiment.

FIG. 4 is a perspective view of first unit 100 (the tablet type computer) of electronic device 1 according to the present exemplary embodiment. Lower side 100S of first unit 100 is provided with engageable part 110 serving as the lock mechanism component on first unit 100 side. Engageable part 110 can be engaged with engaging member 443 of engaging part 440 (see FIGS. 7A and 7B) that constitutes the lock mechanism on second unit 200 side. Two engageable parts 110 are provided on lower side 100S at intervals in the width direction of first unit 100.

Figure 5:
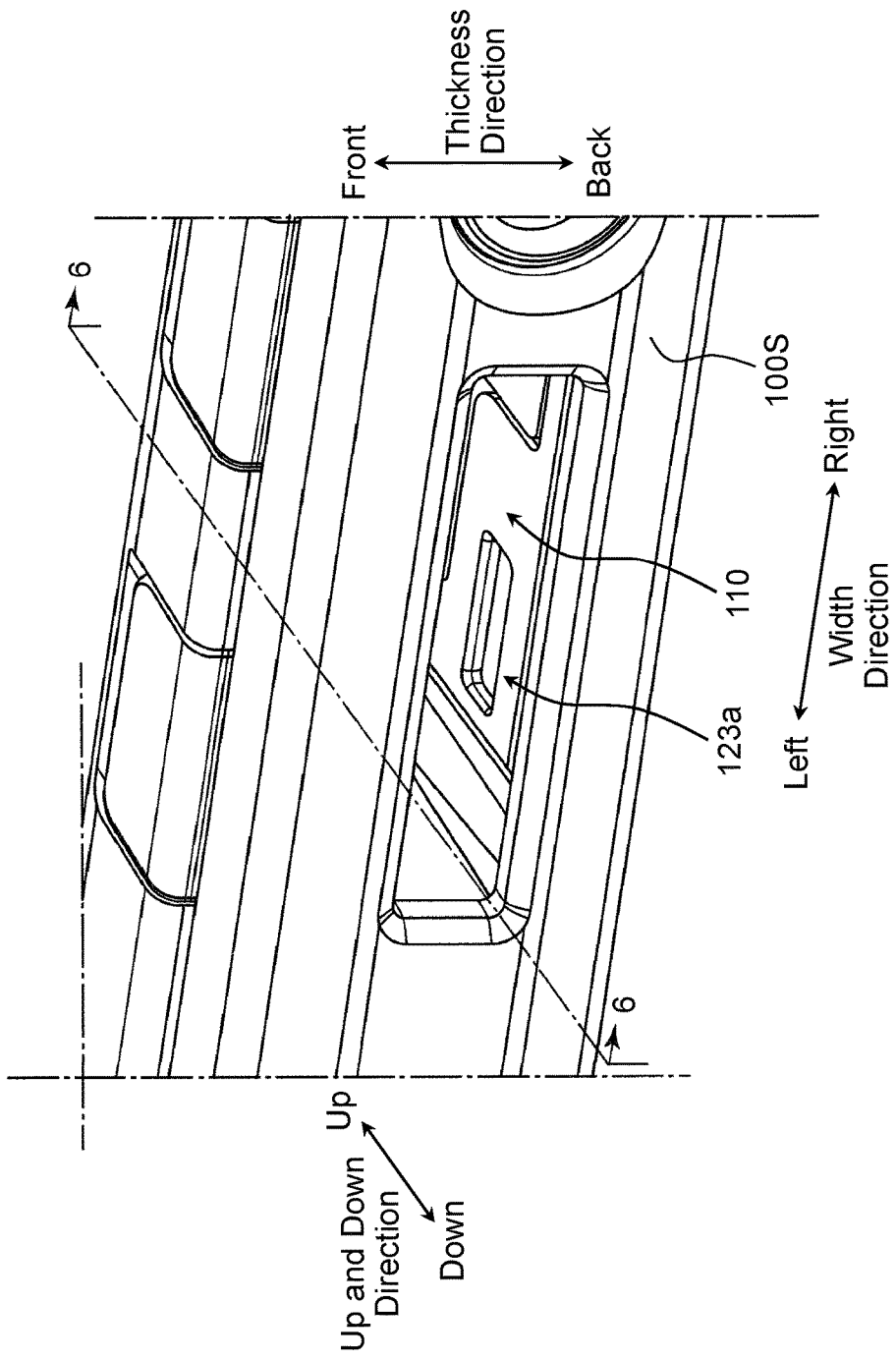
FIG. 5 is an enlarged perspective view of an engageable part of the first unit of the electronic device according to the present exemplary embodiment.
Figure 6:
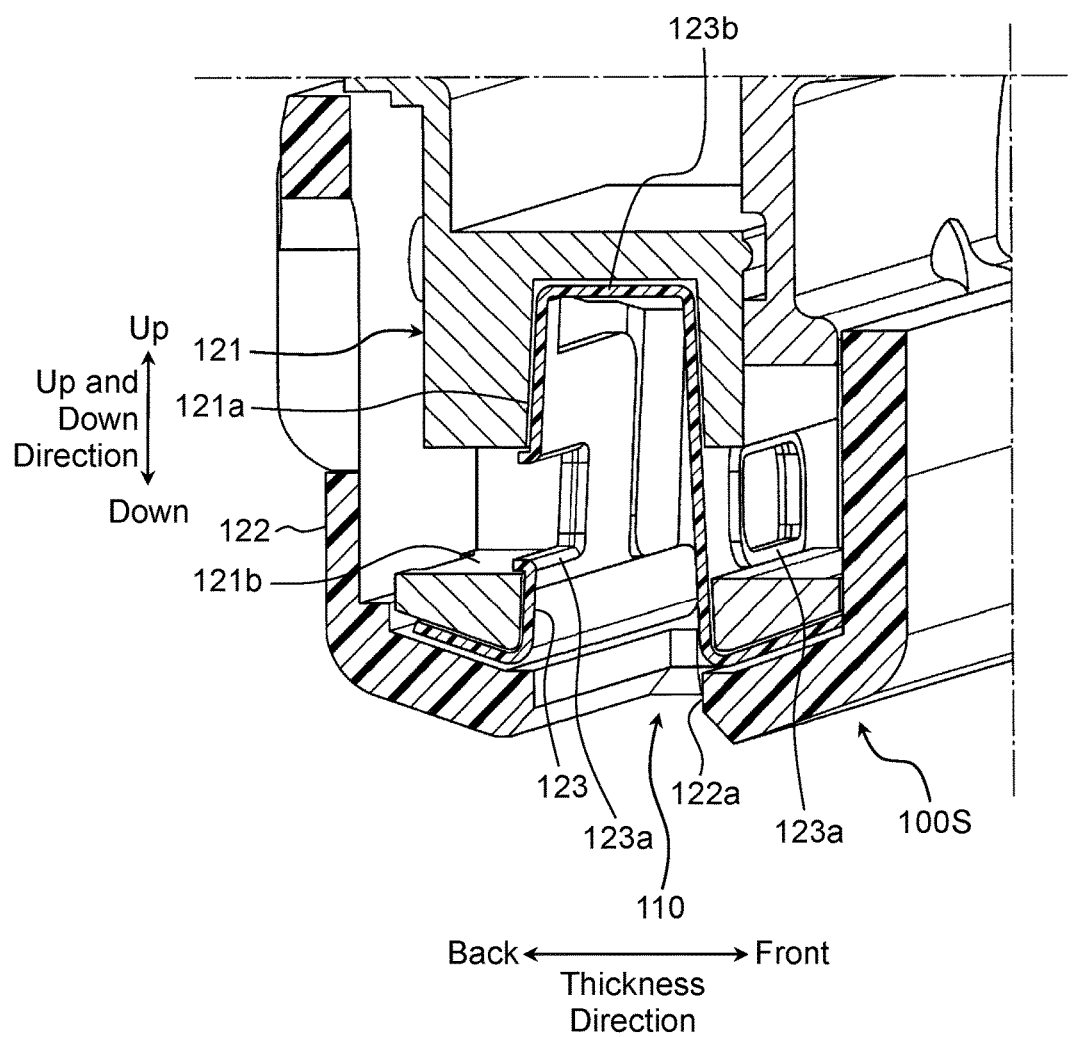
FIG. 6 is a sectional view taken along line 6-6 in FIG. 5.

FIG. 5 is an enlarged perspective view of engageable part 110 of first unit 100 included in electronic device 1 according to the present exemplary embodiment. FIG. 6 is a sectional view taken along line 6-6 in FIG. 5. As shown in these drawings, engageable part 110 is constituted as a recess capable of engaging with engaging member 443 described below. First unit 100 has metal frame 121 and resinous side cover 122. Frame 121 is a member that constitutes a part of a framework and an outer surface of first unit 100. Side cover 122 is a frame-shaped member that covers an outer surface of lower side 100S of first unit 100. Frame 121 has recess 121a, and side cover 122 has opening 122a. Metal protection member 123 is mounted on an inner surface of recess 121a of frame 121. Protection member 123 is provided with engagement hole 123a capable of engaging with one of a pair of engaging projections 443a (see FIG. 7B), which is described below, of engaging member 443. Further, engagement recess 121b capable of engaging with another engaging projection 443a of engaging member 443 is provided within recess 121a of frame 121. Here, it is desirable that protection member 123 be made of a stainless material rather than a magnesium material to prevent scraping.

[1-2-2. Configurations of Lock Mechanism Components on Second Unit Side and of Socket]

[1-2-2-1. Configuration of Socket]

Figure 8A:
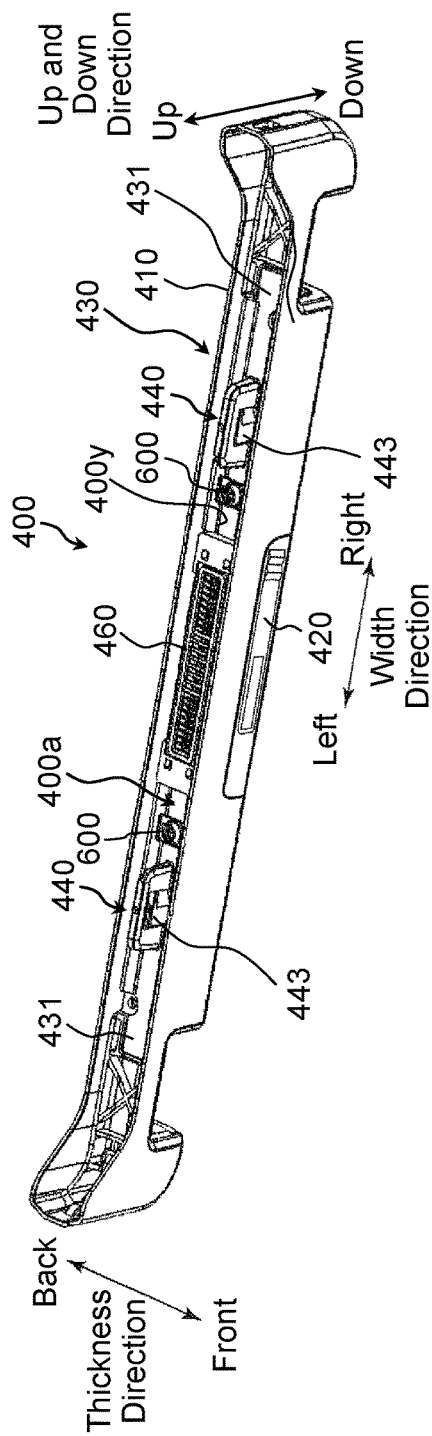
FIG. 8A is a perspective view of the socket of the second unit included in the electronic device according to the present exemplary embodiment (a state in which the engaging member is located at a second rotational position)
Figure 8B:
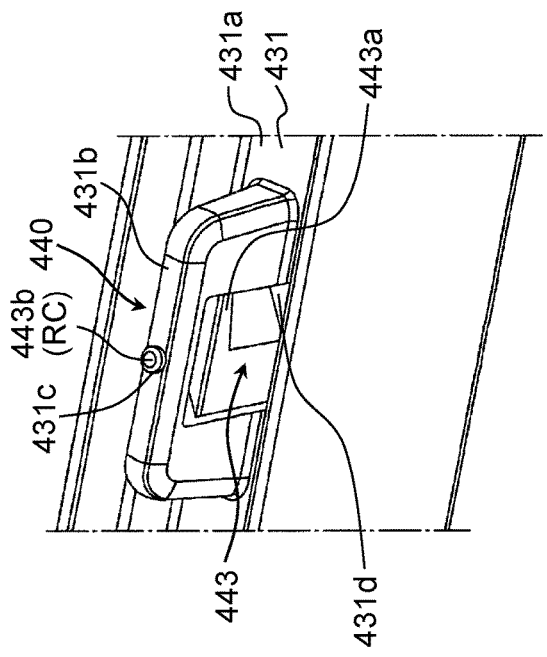
FIG. 8B is an enlarged perspective view of the engaging member of the socket of the second unit included in the electronic device according to the present exemplary embodiment (the state in which the engaging member is located at the second rotational position)

The lock mechanism components on second unit 200 side are housed in socket 400. FIGS. 7A and 7B are external views of socket 400 of electronic device 1 according to the present exemplary embodiment (a state in which engaging member 443 is located at a first rotational position). Specifically, FIG. 7A is a perspective view of socket 400, and FIG. 7B is an enlarged perspective view of engaging member 443 portion. FIGS. 8A and 8B are external views of socket 400 of electronic device 1 according to the present exemplary embodiment (a state in which engaging member 443 is located at a second rotational position). Specifically, FIG. 8A is a perspective view of socket 400, and FIG. 8B is an enlarged perspective view of engaging member 443 portion.

Figure 11:
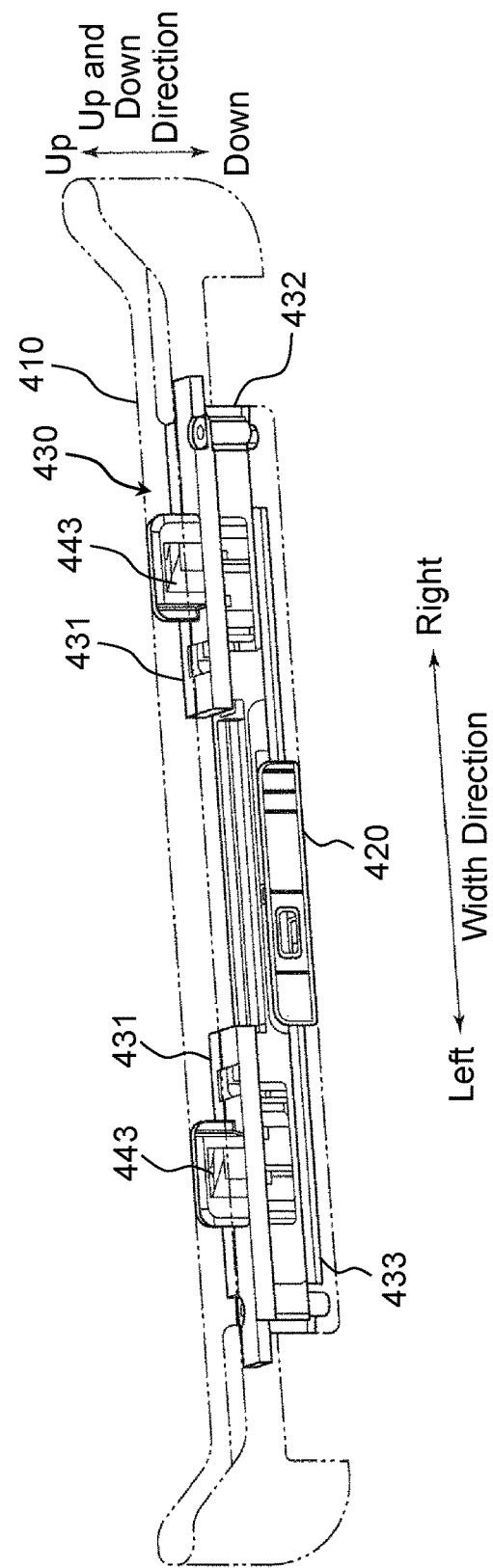
FIG. 11 is a perspective view of socket side components of lock mechanism components included in the electronic device according to the present exemplary embodiment.

Socket 400 has socket body 410, operating member 420, engaging part 440 having engaging member 443, and drive mechanism 430 (see FIG. 11).

Socket 400 has a boat shape extending in the width direction of electronic device 1, and has recess 400y capable of fitting lower side 100S of first unit 100.

As described below, engaging part 440 is configured so as to be engageable with engageable part 110 of lower side 100S of first unit 100. As described below in detail, engaging member 443 is configured so as to be rotatable around rotating axial center RC (an axial center of rotating shaft 443b) parallel to the up and down direction of socket 400. Two engaging members 443 are provided on an upper surface of base plate 431a of support member 431 at intervals in the width direction of socket 400. When lower side 100S of first unit 100 is fitted in socket 400, two engaging members 443 are disposed in positional relations capable of engaging with engageable parts 110 of first unit 100. Engaging member 443 is disposed so as to protrude further upward than the upper surface of base plate 431a of support member 431 (a predetermined surface of the second unit).

When operating member 420 is located at a first position shown in FIG. 7A (a predetermined position on a left side in the width direction), engaging member 443 is rotated to the first rotational position (a position at which engaging projection 443a of engaging member 443 protrudes from engaging member support part 431b of support member 431 to the front side and the back side in the thickness direction). Engaging member 443 is engaged with engageable part 110. Further, when operating member 420 is located at a second position shown in FIG. 8A (a predetermined position on a right side in the width direction), engaging member 443 is rotated to the second rotational position (a position at which engaging projection 443a of engaging member 443 does not protrude from engaging member support part 431b of support member 431 in the thickness direction). The engagement with engageable part 110 is released.

[1-2-2-2. Socket Body]

FIGS. 9A and 9B are external views of socket body 410 of electronic device 1 according to the present exemplary embodiment. Specifically, FIG. 9A is a perspective view of socket body 410, and FIG. 9B is a side view of socket body 410.

Socket body 410 has a boat shape, and houses drive mechanism 430 (see FIG. 11). Socket body 410 is formed of resin. It should be noted that socket body 410 may be formed of metal, such as magnesium alloy.

Figure 10:
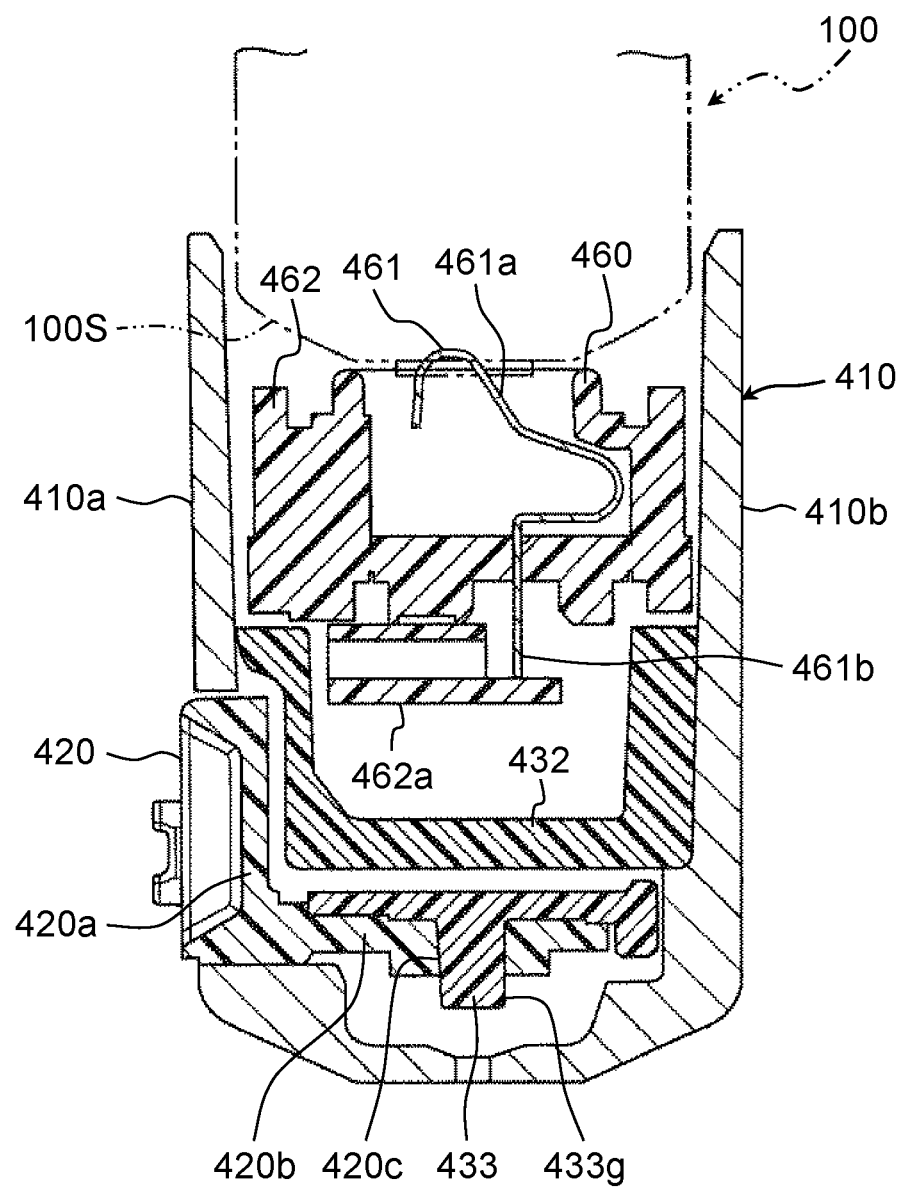
FIG. 10 is a sectional view taken along line 10-10 in FIG. 7A (members are partially omitted)

FIG. 10 is a sectional view taken along line 10-10 in FIG. 7A (members are partially omitted). FIG. 10 shows a shape of a cross section perpendicular to the width direction (a longitudinal direction, an extending direction) of socket 400 at a position on line 10-10. It should be noted that in the present exemplary embodiment, the width directions, the longitudinal directions, and the extending directions of socket 400, lower side 100S, and rear side 300S are an identical direction. In order to facilitate understanding, a term indicating any of the directions is appropriately used according to a content of explanation of each member. Socket body 410 has first outer wall 410a and second outer wall 410b. In a state in which lower side 100S of first unit 100 is housed in socket 400, first outer wall 410a is extended parallel to the extending direction of lower side 100S of first unit 100 (see FIG. 9A), and is parallel to first principal surface 100a of first unit 100. First outer wall 410a supports lower side 100S side of first principal surface 100a. In the housed state, second outer wall 410b is extended parallel to the extending direction of lower side 100S of first unit 100 (see FIG. 9B), and is parallel to second principal surface 100b (the surface on the back side) of first unit 100. Second outer wall 410b supports lower side 100S side of second principal surface 100b. A shape of a cross section of socket body 410 perpendicular to the extending direction is a substantially U shape.

According to the configuration, first unit 100 is supported in a state in which lower side 100S side of first principal surface 100a and lower side 100S side of second principal surface 100b are sandwiched between first outer wall 410a and second outer wall 410b of socket 400.

Here, as shown in FIGS. 3A and 3B, on lower side 100S side located below display 101 on first principal surface 100a of first unit 100, operation switches 103 and indicators 104 are disposed on a central side in the width direction of socket 400 (at a portion other than end sides in the extending direction). Accordingly, at this portion, it is necessary that a length in an up and down direction (a height) of first outer wall 410a is set to a height that does not interfere with operation switches 103 and indicators 104, and a sufficient height cannot be secured.

Therefore, in present exemplary embodiment, as shown in FIG. 9B, in socket body 410, length L1 is a length of first outer wall 410a and second outer wall 410b in the up and down direction (a direction perpendicular to the extending direction) of socket 400 on the end sides in the width direction (the extending direction) of socket 400. Length L2 is a length of first outer wall 410a and second outer wall 410b in the up and down direction of the portion other than the end sides in the width direction (the extending direction) of socket 400. Length L1 is set longer than length L2.

With this configuration, on lower side 100S side of first principal surface 100a of first unit 100, even in a case where operation switches 103 (a second operation part) and/or indicators 104 are disposed on the central side in the width direction, first unit 100 can be supported at upper positions on the end sides in the width direction by first outer wall 410a and second outer wall 410b. Therefore, a support state of first unit 100 housed in socket 400 of second unit 200 can be stabilized.

Further, as shown in FIG. 7A, socket body 410 has third outer wall 410c and fourth outer wall 410d. Third outer wall 410c couples a right end in the width direction (the extending direction) of first outer wall 410a to a right end in the width direction of second outer wall 410b. Fourth outer wall 410d couples a left end in the width direction of first outer wall 410a to a left end in the width direction of second outer wall 410b.

This improves strength of socket 400 (socket body 410). For example, falling of first outer wall 410a and second outer wall 410b in directions separating from each other can be suppressed. As a result, the support state of first unit 100 attached to socket 400 of second unit 200 can be further stabilized.

[1-2-2-3. Operating Member]

Operating member 420 is a member for receiving unlock operation by the user. Operating member 420 is formed of resin. It should be noted that operating member 420 may be formed of metal, such as magnesium alloy. Operating member 420 is supported by socket 400 such that operating member 420 is linearly movable with respect to socket body 410 between the first position and the second position in the width direction of socket 400.

As shown in FIG. 10 mentioned above, operating member 420 has operating part 420a having a surface parallel to first outer wall 410a of socket body 410 and coupling part 420b coupled to coupling member 433. A shape of a cross section of operating member 420 perpendicular to the width direction (the extending direction) of socket 400 is a substantially L shape. Accordingly, for example, when the user opens first unit 100 with respect to second unit 200 as shown in FIG. 1 to operate electronic device 1, the user can operate operating part 420a from first principal surface 100a side provided with display 101 that the user faces.

[1-2-2-4. Engaging Member and Drive Mechanism]

FIG. 11 is a perspective view of socket 400 side components of lock mechanism components of electronic device 1 according to the present exemplary embodiment.

Socket 400 side components of the lock mechanism components are aforementioned operating member 420, engaging member 443, and drive mechanism 430.

[1-2-2-4-1. Drive Mechanism]

Drive mechanism 430 rotates engaging member 443 to the first rotational position when operating member 420 is moved to the first position shown in FIG. 7A. Drive mechanism 430 rotates engaging member 443 to the second rotational position when operating member 420 is moved to the second position shown in FIG. 8A. In other words, drive mechanism 430 converts the linear movement of operating member 420 between the first position and the second position into the rotation of engaging member 443 between the first rotational position and the second rotational position.

Figure 18A:
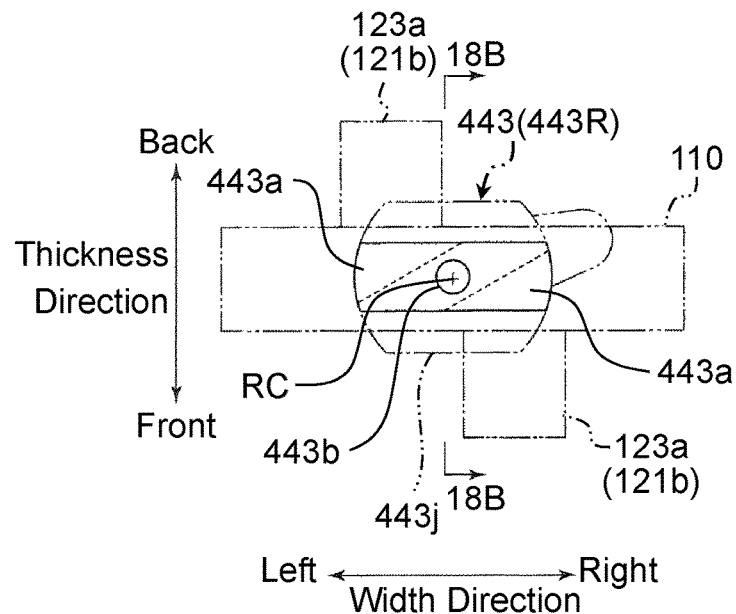
FIG. 18A is a plan view for explaining a state in which the engagement by the lock mechanism of the electronic device according to the present exemplary embodiment is released.
Figure 18B:
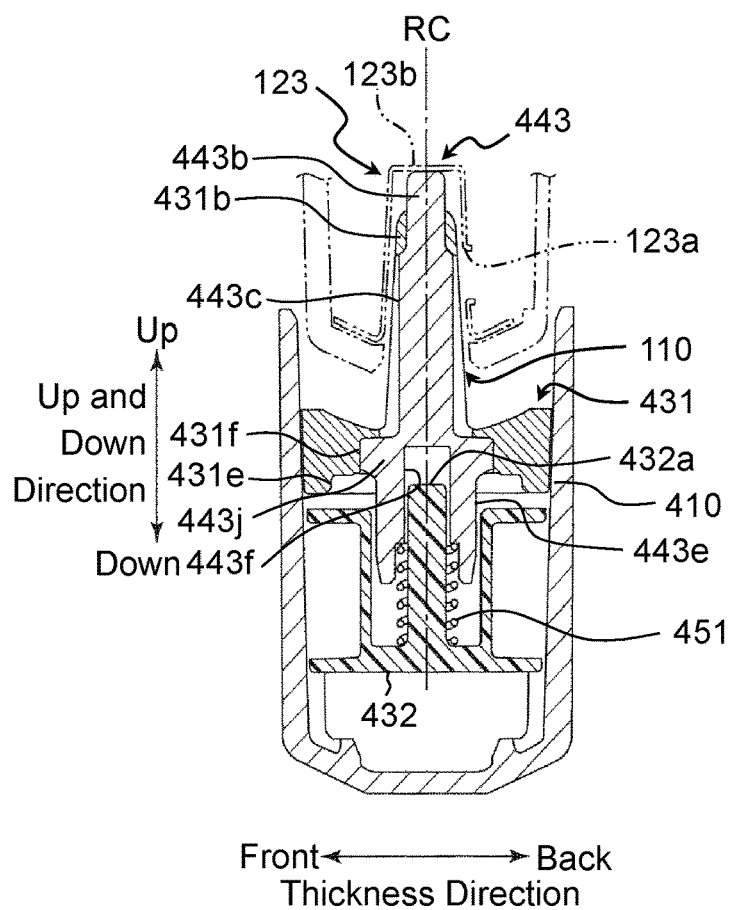
FIG. 18B is a sectional view taken along line 18B-18B in FIG. 18A (a view in which the engageable part is added to the sectional view of FIG. 14B)

Drive mechanism 430 has support member 431, base member 432, coupling member 433, first spring 434 (see FIGS. 19A and 19B), and second spring 451 (see FIG. 18B).

Figure 12D:
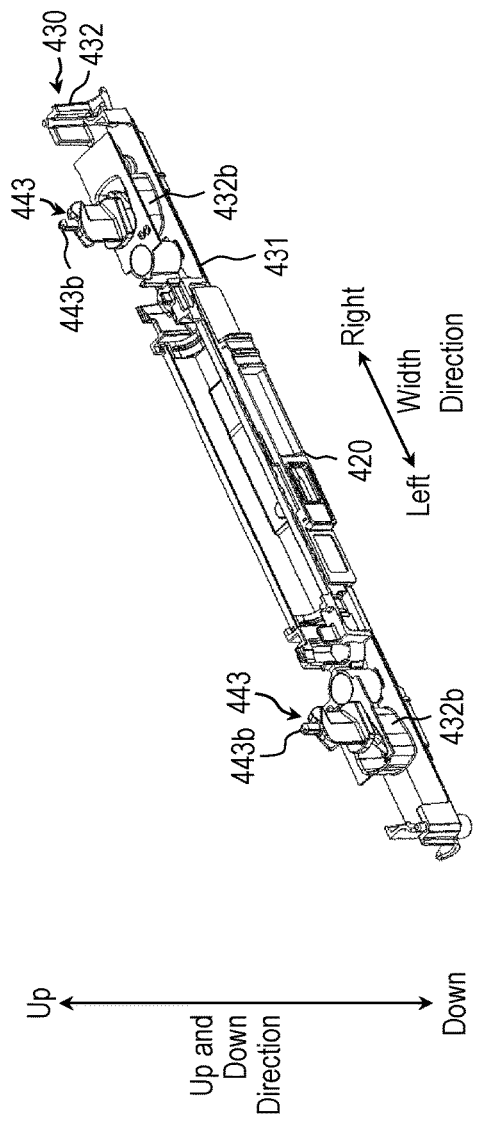
FIG. 12D is a perspective view of the socket side components of the lock mechanism components included in the electronic device according to the present exemplary embodiment (the state in which the engaging member is located at the second rotational position)
Figure 12E:
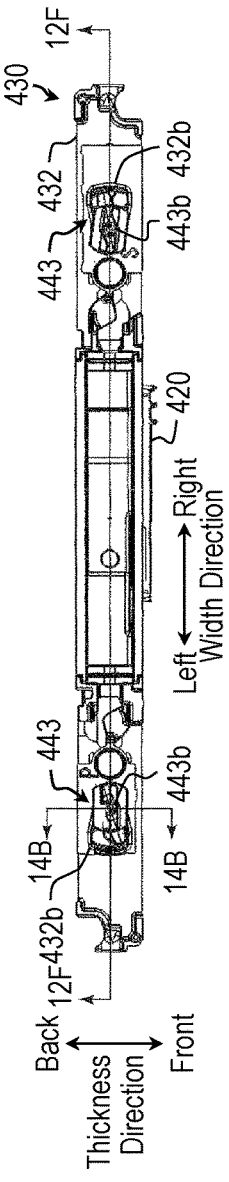
FIG. 12E is a plan view of the socket side components of the lock mechanism components included in the electronic device according to the present exemplary embodiment (the state in which the engaging member is located at the second rotational position)
Figure 12F:
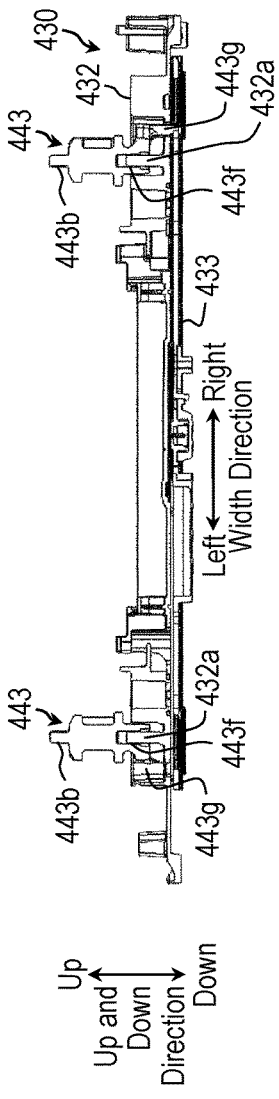
FIG. 12F is a sectional view taken along line 12F-12F in FIG. 12E.

FIGS. 12A to 12C are external views of socket 400 side components (members are partially omitted) of the lock mechanism components of electronic device 1 according to the present exemplary embodiment (a state in which the engaging member is located at the first rotational position). Specifically, FIG. 12A is a perspective view, FIG. 12B is a plan view, and FIG. 12C is a sectional view taken along line 12C-12C in FIG. 12B. FIGS. 12D to 12F are external views of the socket side components (members are partially omitted) of the lock mechanism components of the electronic device according to the present exemplary embodiment (a state in which the engaging member is located at the second rotational position). Specifically, FIG. 12D is a perspective view, FIG. 12E is a plan view, and FIG. 12F is a sectional view taken along line 12F-12F in FIG. 12E.

Coupling member 433 is a plate-shaped member that extends along the width direction of socket 400, and is fixed to operating member 420. For example, as shown in FIG. 10, projection 433g that protrudes downward is fitted into coupling hole 420c of coupling part 420b of operating member 420. Accordingly, coupling member 433 is fixed to operating member 420. Coupling member 433 is supported by socket body 410 so as to be movable along a moving direction of operating member 420 (the width direction of socket 400). Coupling member 433 is, for example, formed of resin. It should be noted that coupling member 433 may be formed of metal if a sliding ability substantially equal to a sliding ability of the resin is secured.

Figure 15:
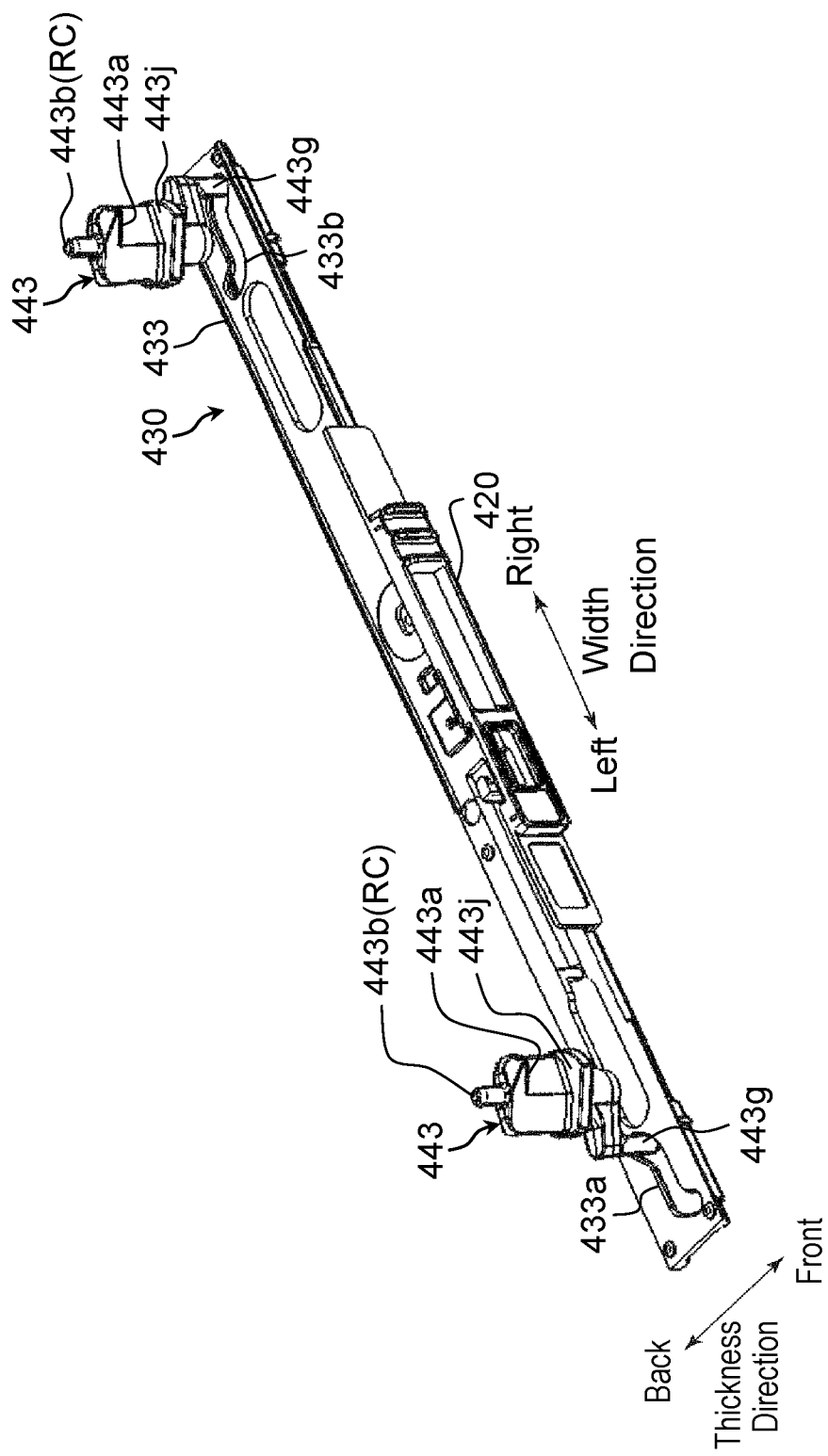
FIG. 15 is a perspective view of a coupling member, an operating member, and the engaging member that configure the lock mechanism of the electronic device according to the present exemplary embodiment (a state in which the operating member is located at a first position and the engaging member is located at the first rotational position)
Figure 17:
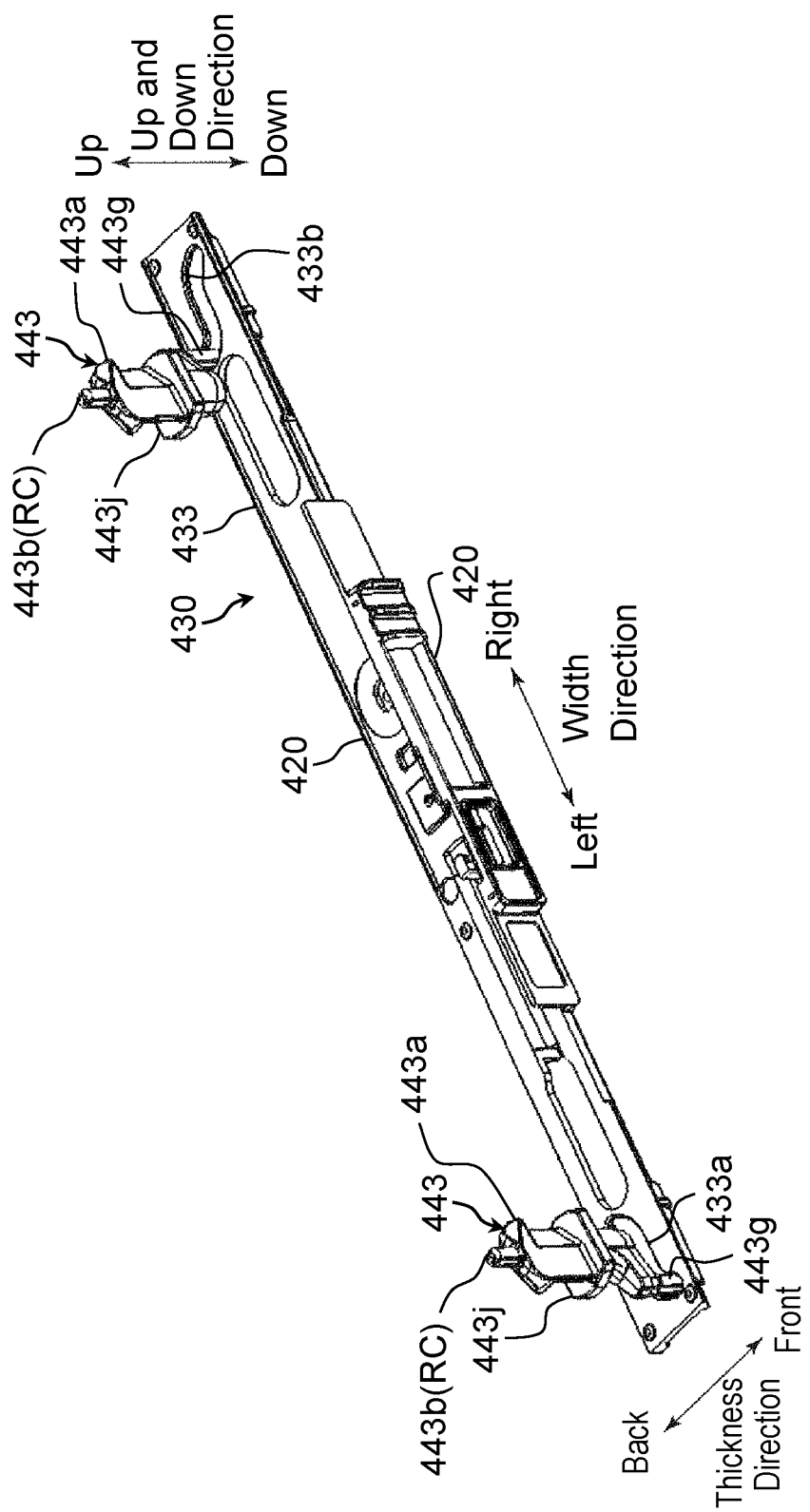
FIG. 17 is a perspective view of the coupling member, the operating member, and the engaging member that configure the lock mechanism of the electronic device according to the present exemplary embodiment (a state in which the operating member is located at a second position and the engaging member is located at the second rotational position)

Coupling member 433 has groove 433a (433b), with which engaging shaft 443g of engaging member 443 is engaged relatively movably (see FIGS. 15 and 17).

Groove 433a (433b) is formed in a meandering manner. When operating member 420 is moved to the first position as shown in FIG. 15, engaging member 443 is rotated to the first rotational position around rotating axial center RC (the axial center of rotating shaft 443b). When operating member 420 is moved to the second position as shown in FIG. 17, engaging member 443 is rotated to the second rotational position around rotating axial center RC. Specifically, groove 433a is formed into a substantially inverted S shape such that a left end in the width direction is located on the further front side than other portions in the thickness direction and that a right end in the width direction is located on the further back side than the other portions in the thickness direction. On the other hand, groove 433b is formed into a substantially S shape such that a left end in the width direction is located on the further back side than other parts in the thickness direction and that a right end in the width direction is located on the further front side than the other parts in the thickness direction.

Returning to FIGS. 12A and 12B, base member 432 is a member that extends along the width direction of socket 400, and is fixed to socket body 410. Base member 432 is, for example, formed of resin. Base member 432 has rotation center shaft 432a and rotation regulating wall 432b.

Rotation center shaft 432a is inserted into shaft hole 443f formed at a lower part of engaging member 443, and supports engaging member 443 at its lower side so as to be rotatable.

Rotation regulating wall 432b abuts on arm 443h formed at the lower part of engaging member 443 during rotation of engaging member 443. Accordingly, the rotation of engaging member 443 is regulated within a range between the first rotational position and the second rotational position.

Returning to FIGS. 7A and 7B, support member 431 is disposed on each of the right and left end sides in the width direction of socket 400. Right and left support members 431 have a symmetrical structure. Each support member 431 is a plate-shaped member that extends along the width direction of socket 400. Each support member 431 is fixed to socket body 410. Support member 431 is, for example, formed of metal. Each support member 431 has base plate 431a, engaging member support part 431b, and engaging member arrangement hole 431d.

Base plate 431a is mounted on base member 432, and is fixed to base member 432 and socket body 410 by using a screw (not shown).

Engaging member arrangement hole 431d is a hole that penetrates base plate 431a in the up and down direction of socket 400, and is disposed such that an upper side of engaging member 443 is rotatable. With this configuration, the upper side of engaging member 443 protrudes further upward than the upper surface of base plate 431a.

Engaging member support part 431b is stood on base plate 431a over engaging member arrangement hole 431d in the width direction. Engaging member support part 431b has a gate shape. Engaging member support part 431b has insertion hole 431c that penetrates in the up and down direction of socket 400. Rotating shaft 443b of engaging member 443 is inserted into insertion hole 431c. With this configuration, engaging member support part 431b supports the upper side of engaging member 443 such that engaging member 443 is rotatable around rotating shaft 443b.

Figure 20:
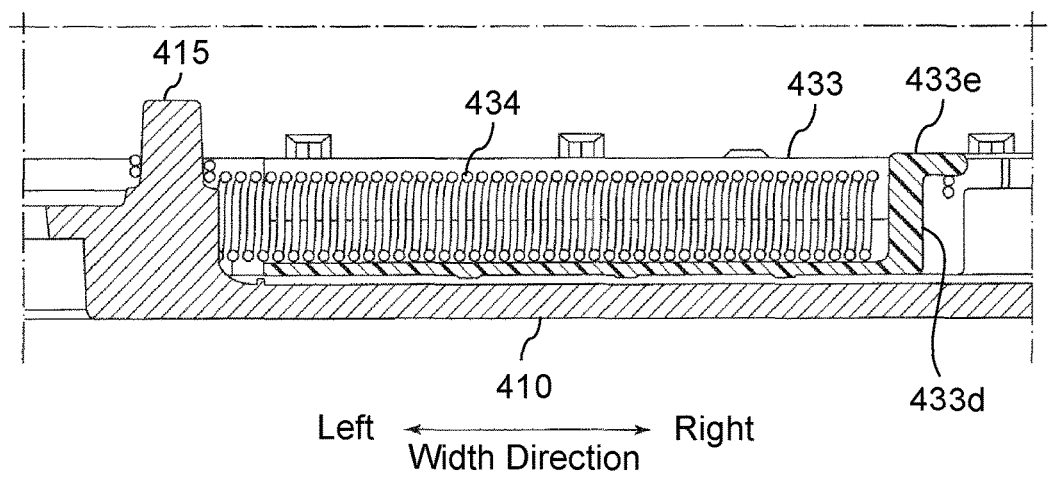
FIG. 20 is an enlarged view of a portion shown by arrow H in FIG. 19B.
Figure 21A:
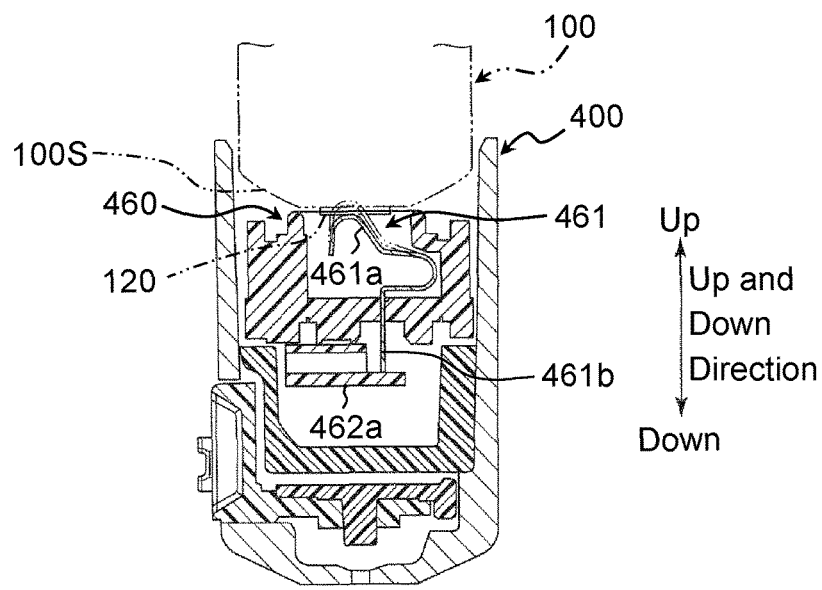
FIG. 21A is a view for explaining a state of a connector pin in a state in which the first unit is attached to the socket in the electronic device according to the present exemplary embodiment (a sectional view identical to the sectional view in FIG. 10)
Figure 21B:
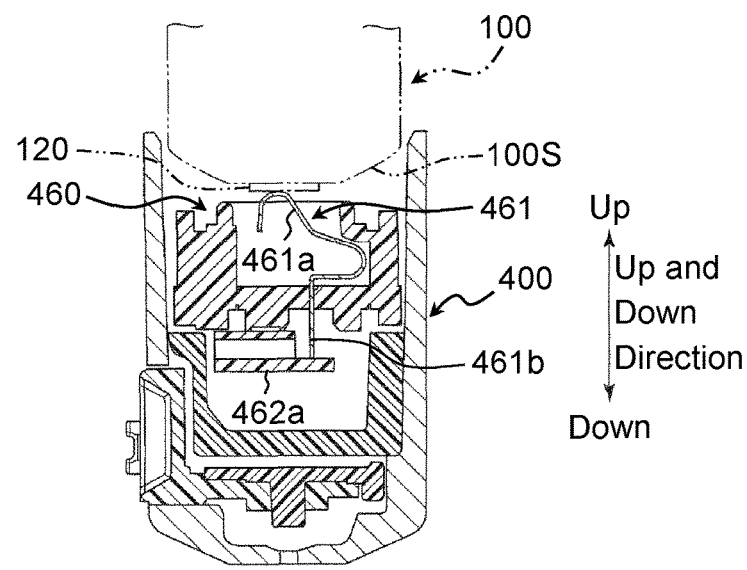
FIG. 21B is a view for explaining a state in which the first unit attached to the socket is lifted by biasing force of the connector pin during unlocking in the electronic device according to the present exemplary embodiment (a sectional view identical to the sectional view in FIG. 10)

FIGS. 19A and 19B are external views of the socket body, the coupling member, and the spring that configure the lock mechanism of the electronic device according to the present exemplary embodiment. Specifically, FIG. 19A is a plan view when the operating member is located at the first position, and FIG. 19B is a sectional view taken along line 19B-19B in FIG. 19A. FIG. 20 is an enlarged view of a portion shown by arrow H in FIG. 19B.

First spring 434 is housed in spring housing 433d of coupling member 433. One end of first spring 434 is locked to spring lock part 433e of coupling member 433, and another end of first spring 434 is locked to spring lock part 415 of socket body 410. First spring 434 biases coupling member 433 and operating member 420 fixed to coupling member 433 to the first position side in the width direction of the device.

A configuration of second spring 451 is described below.
[1-2-2-4-2. Engaging Member]

Figure 13A:
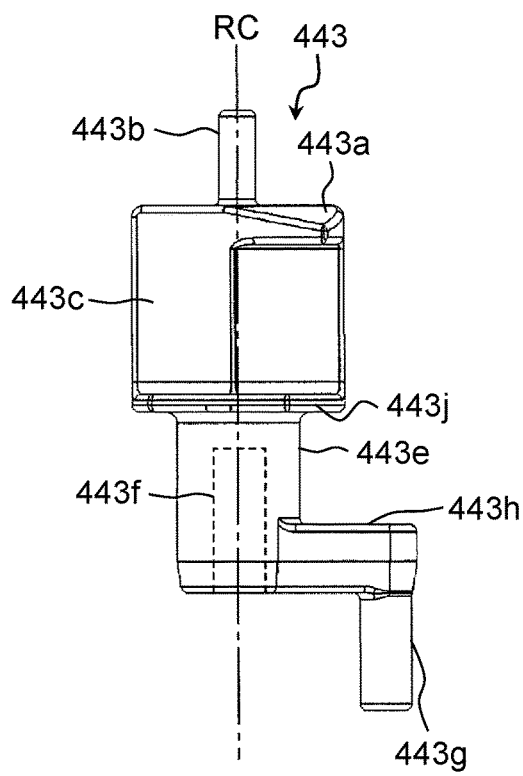
FIG. 13A is a front view of the engaging member that configures the lock mechanism of the electronic device according to the present exemplary embodiment.
Figure 13B:
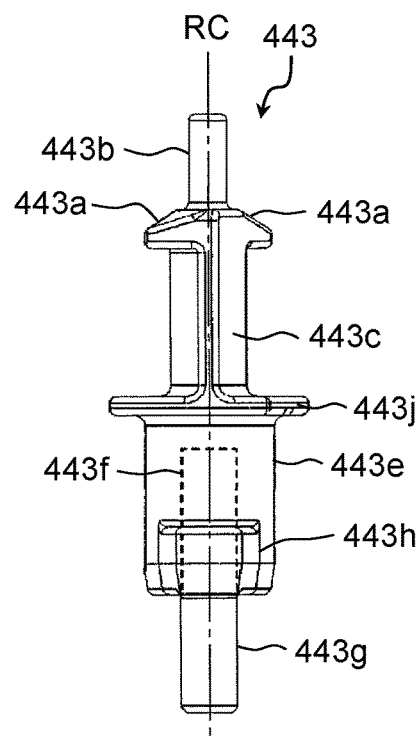
FIG. 13B is a side view of the engaging member that configures the lock mechanism of the electronic device according to the present exemplary embodiment.
Figure 13C:
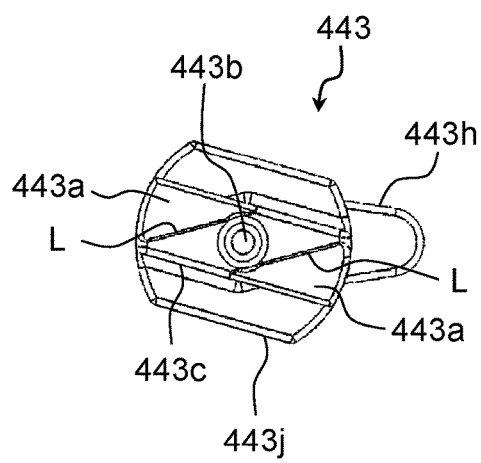
FIG. 13C is a plan view of the engaging member that configures the lock mechanism of the electronic device according to the present exemplary embodiment.

FIGS. 13A to 13C are external views of engaging member 443 that configures the lock mechanism of electronic device 1 according to the present exemplary embodiment. Specifically, FIG. 13A is a front view, FIG. 13B is a side view, and FIG. 13C is a plan view.

As shown in FIGS. 13A to 13C, engaging member 443 has aforementioned rotating shaft 443b, engaging body 443c, fitting projection 443j, tubular part 443e, arm 443h, and engaging shaft 443g in this order from the top.

Rotating shaft 443b is provided on an upper end side of engaging member 443.

Engaging body 443c has a pair of engaging projections 443a formed so as to protrude opposite to each other in a radial direction across rotating shaft 443b. Engaging projection 443a is formed by cutting off sides of a cylindrical object in parallel across rotating shaft 443b (rotating axial center RC), and further, regarding a portion other than vicinity of the upper surface, by scraping off the portion outside in the radial direction of lines indicated by L.

Tubular part 443e has shaft hole 443f that opens at a lower end. An axial center of shaft hole 443f is formed coaxially with the axial center of rotating shaft 443b.

Arm 443h extends from the lower end of tubular part 443e outward in the radial direction.

Engaging shaft 443g extends downward from an outer end in the radial direction of arm 443h and parallel to rotating shaft 443b (rotating axial center RC).

Fitting projection 443j is formed at an upper end of tubular part 443e so as to protrude in the radial direction. As seen from FIG. 13C, fitting projection 443j of engaging member 443 viewed in the axial direction has a shape in which sides of a disc are cut off in parallel across rotating axial center RC.

Figure 13D:
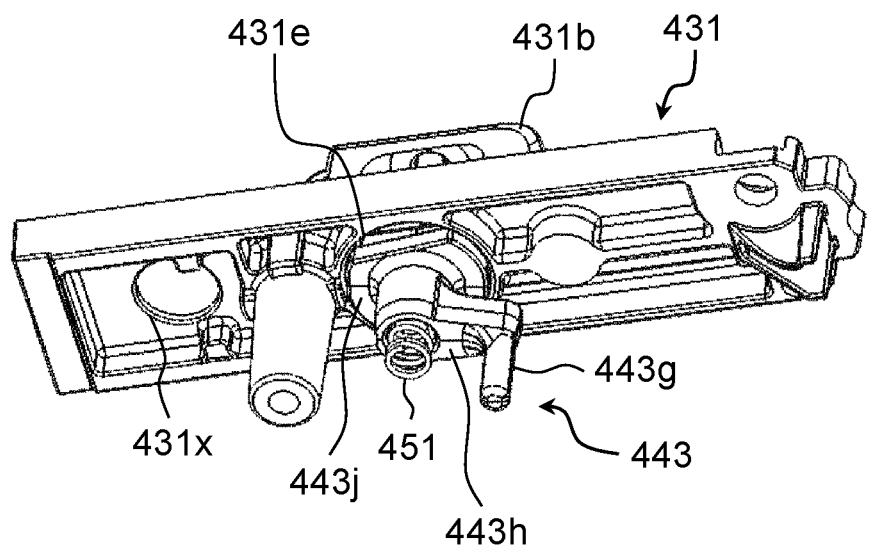
FIG. 13D is a perspective view, as seen from below, of a support member, the engaging member, and a spring that configure the lock mechanism of the electronic device according to the present exemplary embodiment.
Figure 13E:
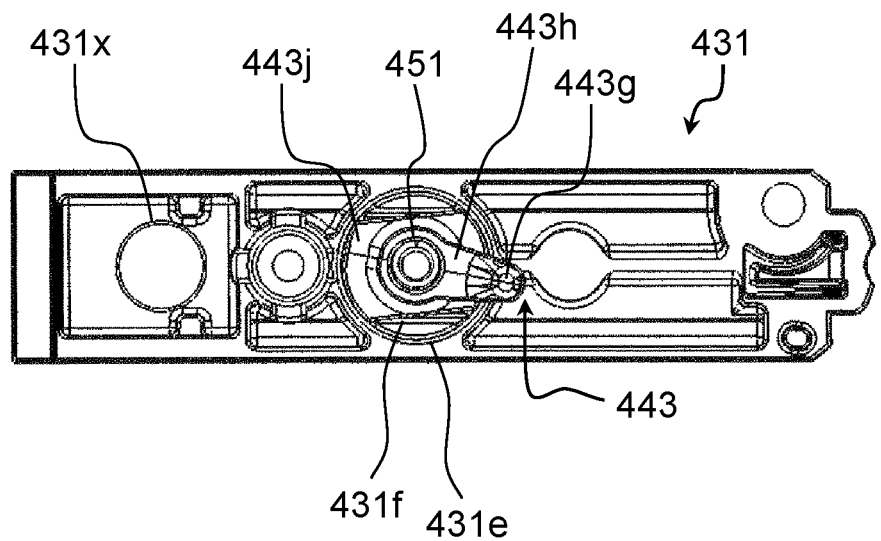
FIG. 13E is a bottom view of the support member, the engaging member, and the spring that configure the lock mechanism of the electronic device according to the present exemplary embodiment.

FIGS. 13D and 13E are external views of support member 431, engaging member 443, and second spring 451 that configure the lock mechanism of the electronic device according to the present exemplary embodiment. Specifically, FIG. 13D is a perspective view seen from below, and FIG. 13E is a bottom view.

A lower surface of support member 431 is provided with first fitting recess 431e and second fitting recess 431f.

A shape of first fitting recess 431e is circular as viewed from a lower surface side. A diameter of the circle of first fitting recess 431e is set slightly larger than a diameter of fitting projection 443j of engaging member 443. Engaging member 443 is rotatable around the rotating axial center in a state in which fitting projection 443j of engaging member 443 is fitted into first fitting recess 431e.

Second fitting recess 431f, as viewed from the lower surface side, has a shape substantially identical to the shape of fitting projection 443j of engaging member 443, as viewed in the rotating axial center direction. A dimension of second fitting recess 431f is set slightly larger than a dimension of fitting projection 443j of engaging member 443. When engaging member 443 is located at the second rotational position, fitting projection 443j of engaging member 443 can be fitted into second fitting recess 431f. In other words, in a state in which fitting projection 443j of engaging member 443 is fitted into second fitting recess 431f, engaging member 443 cannot be rotated around rotating axial center RC. It should be noted that FIGS. 13D and 13E show a state in which fitting projection 443j of engaging member 443 is located within first fitting recess 431e and engaging member 443 is slightly rotated from the first rotational position to the second rotational position side.

Figure 14A:
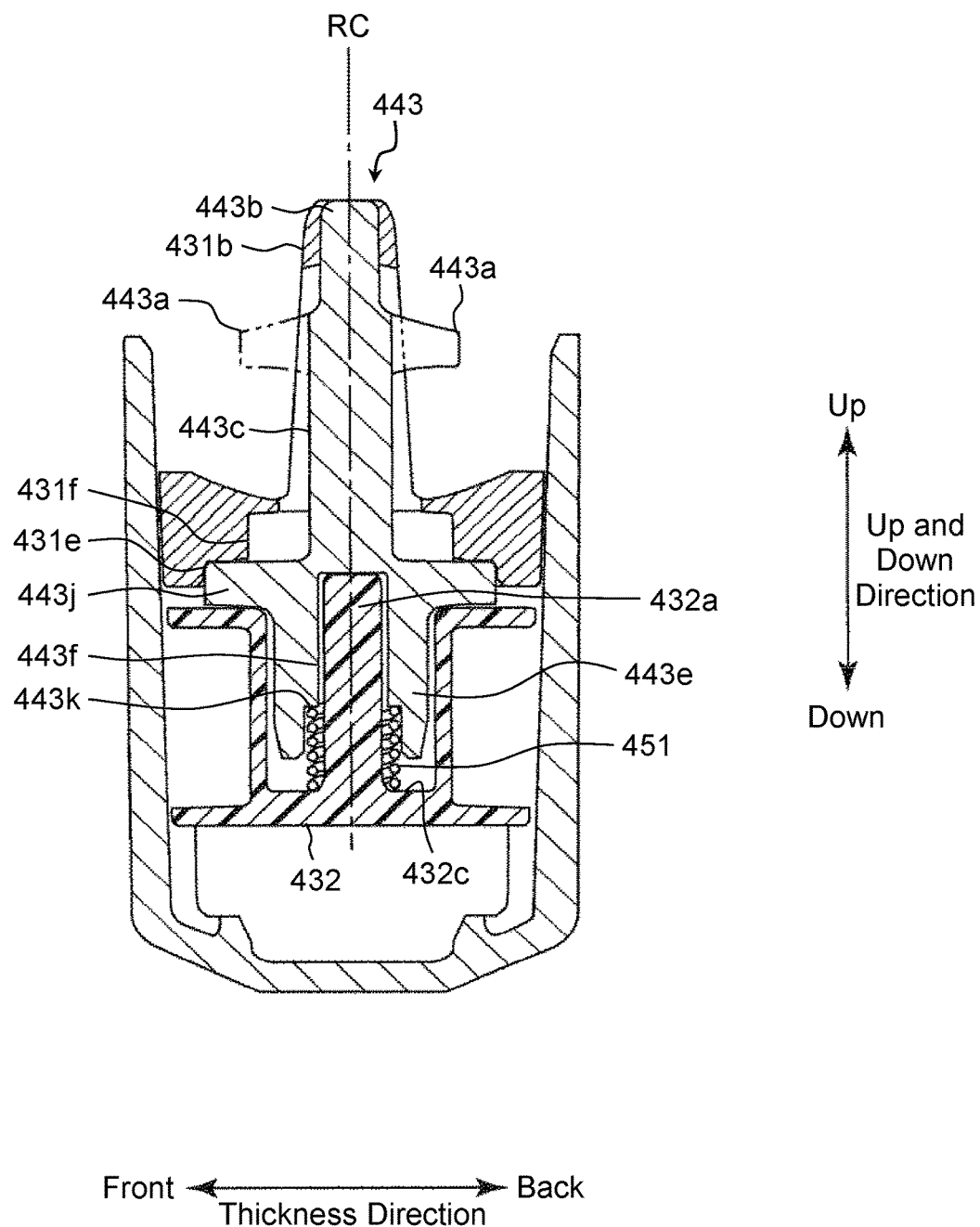
FIG. 14A is a sectional view taken along line 14A-14A in FIG. 12B.
Figure 14B:
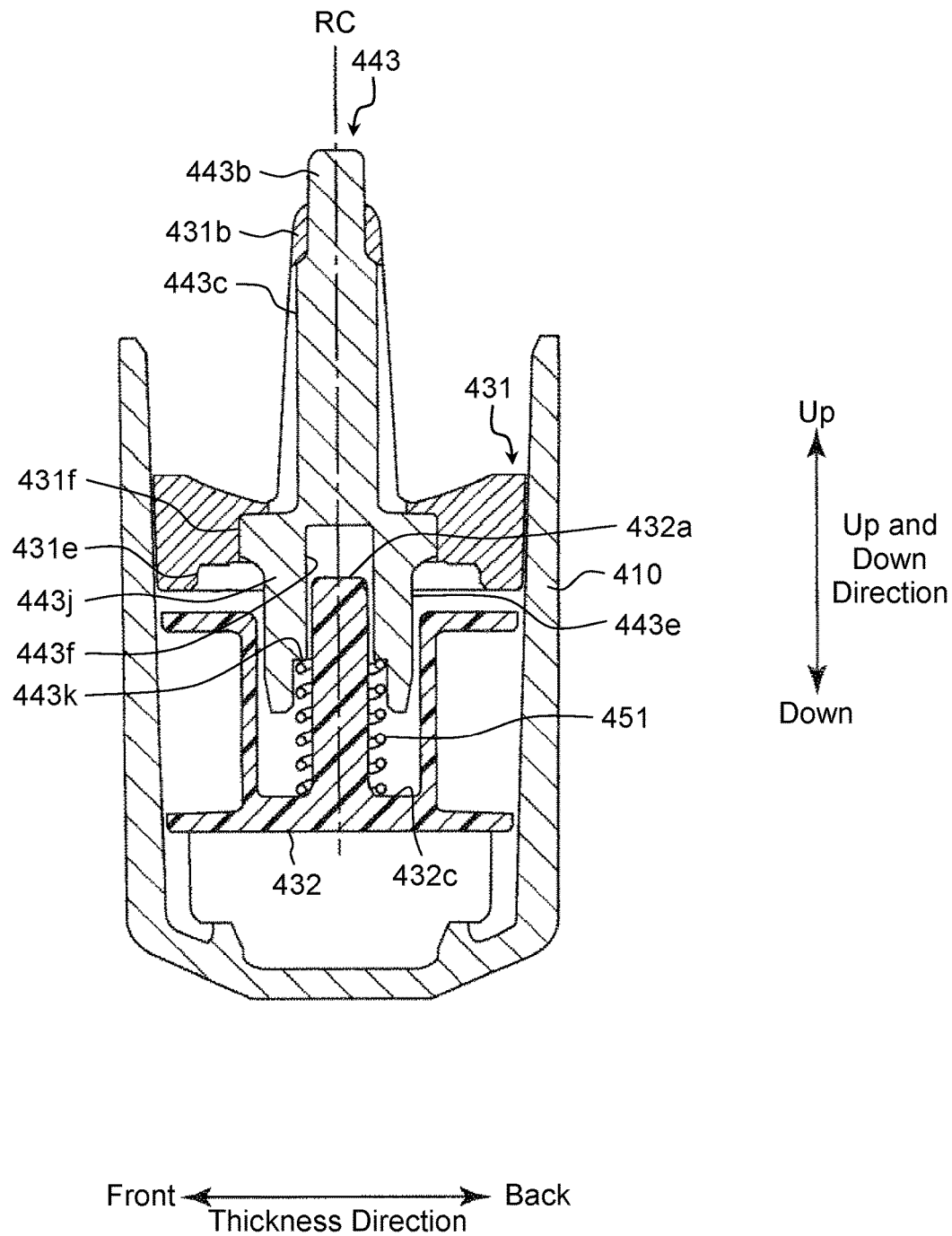
FIG. 14B is a sectional view taken along line 14B-14B in FIG. 12E.

FIG. 14A is a sectional view taken along line 14A-14A in FIG. 12B. FIG. 14A shows a state in which operating member 420 is located at the first position and engaging member 443 is located at the first rotational position. FIG. 14B is a sectional view taken along line 14B-14B in FIG. 12E. FIG. 14B shows a state in which operating member 420 is located at the second position and engaging member 443 is located at the second rotational position. It should be noted that, for convenience of explanation, the members shown in FIGS. 12A to 12F are also added to these drawings. In engaging member 443, rotating shaft 443b is inserted into insertion hole 431c. Further, shaft hole 443f is fitted to rotation center shaft 432a of base member 432. As mentioned above, the axial center of shaft hole 443f is formed coaxially with the axial center of rotating shaft 443b. Accordingly, engaging member 443 is rotatable with the centers of rotating shaft 443b and shaft hole 443f serving as rotating axial center RC (the center).

Second spring 451 is constituted by a coil spring, and rotation center shaft 432a of base member 432 is inserted through second spring 451. One end of second spring 451 abuts on bottom surface 432c of base member 432, and another end of second spring 451 abuts on spring abutment part 443k formed to have a difference in level in shaft hole 443f of engaging member 443. Second spring 451 biases engaging member 443 to a second axial center direction position side in rotating axial center RC direction.

Returning to FIG. 10, connector 460 has connector body 462 and connector pin 461. A plurality of connector pins 461 are arranged in parallel in the extending direction of socket 400 (the width direction of the device) (see FIG. 7A). In the present exemplary embodiment, about 20 connector pins 461 are arranged.

Connector pin 461 has base 461b and electrode 461a. Base 461b extends substantially linearly in the up and down direction, and an end of base 461b abuts on pin support part 462a of connector body 462. Electrode 461a is a part that comes into contact with an electrode of connector 120 of first unit 100. Electrode 461a extends from another end side of base 461b, and is formed in a gently bent spring shape. Connector pin 461 is formed by using an elastic material. When the electrode of connector 120 of first unit 100 is pressed against electrode 461a, an upper side of electrode 461a is elastically deformed and pressed downward. Accordingly, in a state in which first unit 100 is attached to socket 400, the plurality of connector pins 461 are biased in a direction in which first unit 100 is detached from socket 400 (upward). Biasing force has a magnitude enough to be capable of lifting up first unit 100 that is fitted to but is not locked with socket 400.

[1-2-2-4-3. Action of Lock Mechanism]

Figure 16A:
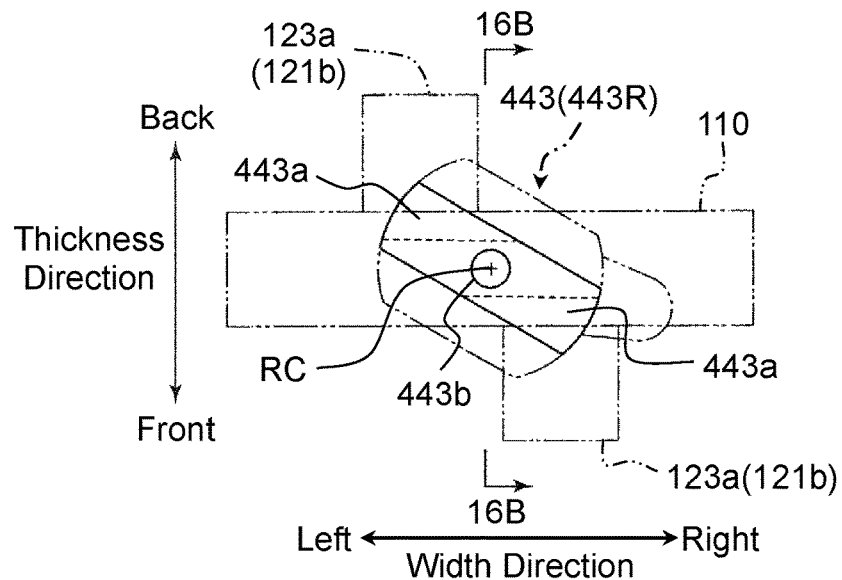
FIG. 16A is a plan view for explaining an engagement state by the lock mechanism of the electronic device according to the present exemplary embodiment.
Figure 16B:
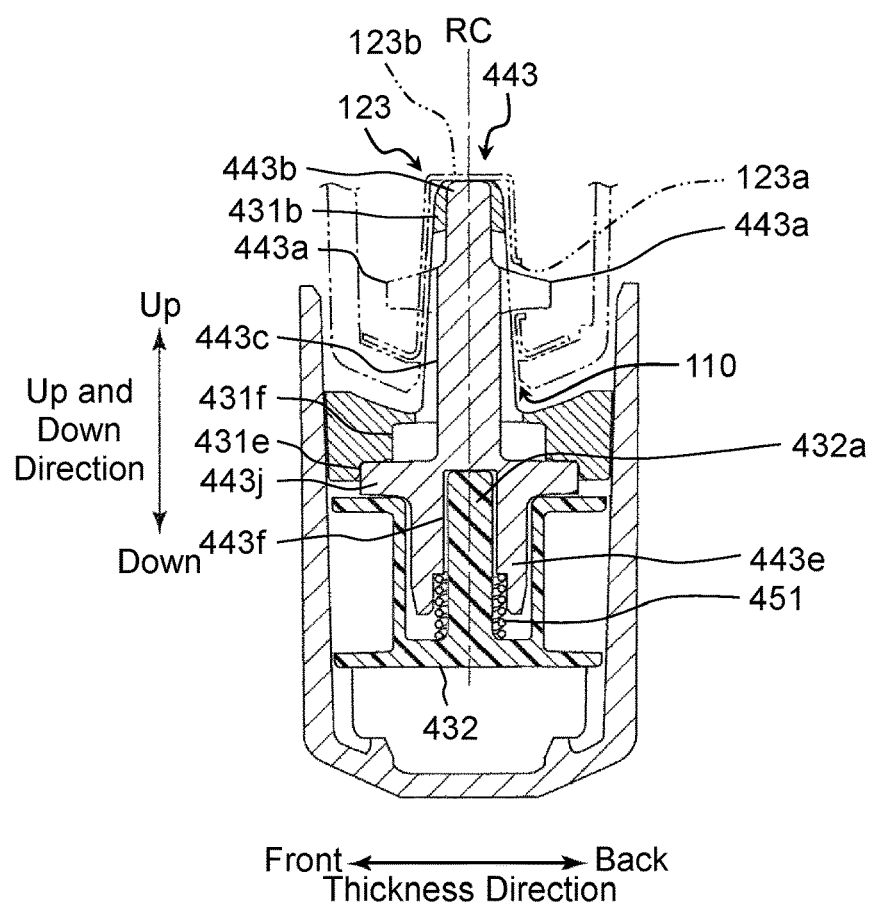
FIG. 16B is a sectional view taken along line 16B-16B in FIG. 16A (a view in which the engageable part is added to the sectional view of FIG. 14A)

FIG. 15 is a perspective view of coupling member 433, operating member 420, and engaging member 443 that configure the lock mechanism of electronic device 1 according to the present exemplary embodiment. Specifically, FIG. 15 is the perspective view when operating member 420 is located at the first position and engaging member 443 is located at the first rotational position. FIGS. 16A and 16B are views for explaining an engagement state by a lock mechanism on a right side in the width direction of the lock mechanism of electronic device 1 according to the present exemplary embodiment. Specifically, FIG. 16A is a plan view for explaining the engagement state, and FIG. 16B is a sectional view taken along line 16B-16B in FIG. 16A.

As shown in FIG. 15, when operating member 420 is located at the first position, engaging shafts 443g of engaging member 443 are respectively located on right end sides of grooves 433a, 433b of coupling member 433. Also, when engaging shaft 443g is rotated to the front side in the thickness direction by groove 433b, engaging member 443 on the right side in the width direction is located at the first rotational position. When engaging shaft 443g is rotated to the back side in the thickness direction by groove 433a, engaging member 443 on the left side in the width direction is located at the first rotational position. At this time, as shown in FIGS. 16A and 16B, engaging projection 443a of engaging member 443 engages with engagement recess 121b of engageable part 110 of first unit 100. With this configuration, first unit 100 is locked to socket 400. At this time, an upper end of rotating shaft 443b of engaging member 443 abuts on plane 123b of protection member 123 included in engagement recess 121b of first unit 100. Accordingly, engaging member 443 is pressed downward against the biasing force of second spring 451, and is located at a first axial center direction position. Further, fitting projection 443j is fitted into first fitting recess 431e of support member 431.

When operating member 420 is moved from this first position to the second position, a state shown in FIGS. 17, 18A, and 18B is reached. FIG. 17 is a perspective view of coupling member 433, operating member 420, and engaging member 443 that configure the lock mechanism of electronic device 1 according to the present exemplary embodiment. Specifically, FIG. 17 is the perspective view when operating member 420 is located at the second position and engaging member 443 is located at the second rotational position. FIGS. 18A and 18B are views for explaining a state in which the engagement by the lock mechanism on the right side in the width direction of the lock mechanism of electronic device 1 according to the present exemplary embodiment is released. Specifically, FIG. 18A is a plan view for explaining the state in which the engagement is released, and FIG. 18B is a sectional view taken along line 18B-18B in FIG. 18A.

As shown in FIG. 17, when operating member 420 is located at the second position, engaging shafts 443g of engaging member 443 are respectively located on left end sides of grooves 433a, 433b of coupling member 433. Also, when engaging shaft 443g is rotated to the back side in the thickness direction by groove 433b, engaging member 443 on the right side in the width direction is located at the second rotational position. When engaging shaft 443g is rotated to the front side in the thickness direction by groove 433a, engaging member 443 on the left side in the width direction is located at the second rotational position. At this time, as shown in FIGS. 18A and 18B, the engagement between engaging projection 443a of engaging member 443 and engagement recess 121b of engageable part 110 of first unit 100 is released. With this configuration, first unit 100 is unlocked from socket 400, and first unit 100 can be detached from second unit 200.

Here, first unit 100 is biased upward through connector 120 of first unit 100 by connector pins 461 of connector 460 of socket 400. Accordingly, unlocked first unit 100 is pressed upward with biasing force of connector pins 461. Further, engaging member 443 is biased upward with the biasing force of second spring 451, and is located at the second rotational position. Further, since first unit 100 is biased upward, engaging member 443 is pressed upward (at the second axial center direction position) with the biasing force of second spring 451, and fitting projection 443j is fitted into second fitting recess 431f of support member 431. With this configuration, the rotation of engaging member 443 around the rotating axial center is regulated. Accordingly, an unlocked state between engaging member 443 and engageable part 110 is maintained. As a result, it is not necessary for the user to continuously grip operating member 420 in a state in which operating member 420 is moved to the second position (an unlocked position) side. Hence, there is no need to draw out first unit 100 from socket 400 with one hand while holding operating member 420 at the second position (the unlocked position) with another hand. In other words, there is no need to perform detachment with both hands. Further, since operating member 420 is maintained at the second position (the unlocked position), the user can visually recognize that the lock mechanism is presently in the unlocked state.

Next, explanation is given of a case where first unit 100 is attached to socket 400, to which first unit 100 is not attached. When first unit 100 is inserted into socket 400, plane 123*b* of protection member 123 of first unit 100 abuts on the upper end of rotating shaft 443*b* of engaging member 443. Then, when first unit 100 is further inserted into socket 400, plane 123*b* of protection member 123 abuts on the upper end of rotating shaft 443*b* of engaging member 443, thereby pressing engaging member 443 downward. Then, when fitting projection 443*j* of engaging member 443 is pressed down from a position of first fitting recess 431*e* to a position of second fitting recess 431*f* of support member 431, that is, when engaging member 443 is pressed down to the first axial center direction position, fitting between fitting projection 443*j* of engaging member 443 and second fitting recess 431*f* of support member 431 is released. With this configuration, rotation regulation of engaging member 443 is released, and engaging member 443 is rotatable around the rotating axial center within first fitting recess 431*e*. Further, since engaging member 443 is rotatable, coupling member 433 whose grooves 433*a*, 433*b* are engaged with engaging shafts 443*g* of engaging member 443 can be moved in the width direction of the device. Here, as mentioned above, coupling member 433 is biased (pulled) by first spring 434 to the first position side of operating member 420. Accordingly, coupling member 433 and operating member 420 coupled to coupling member 433 are moved to the first position side, and engaging member 443 is rotated to the first rotational position by the movement of coupling member 433. As a result, as shown in FIGS. 16A and 16B, engaging projection 443*a* of engaging member 443 engages with engagement recess 121*b* of engageable part 110 of first unit 100. With this configuration, first unit 100 is locked to socket 400.

Here, when the user attaches first unit 100 to socket 400, there may be a case where one end side in the extending direction of lower side 100S of first unit 100 is sufficiently inserted into socket 400, while another end side is not sufficiently inserted. In this case, engaging member 443 on another end side is not pressed down by plane 123*b* of protection member 123 of first unit 100. Accordingly, the engagement between fitting projection 443*j* of engaging member 443 on the other end side and second fitting recess 431*f* of support member 431 is not released. As a result, engaging member 443 on the other end side cannot be rotated. Hence, coupling member 433 and operating member 420 coupled to coupling member 433 are not moved to the first position side. Therefore, the user can visually recognize that first unit 100 is not locked to socket 400 based on a fact that operating member 420 is not moved to the first position side. As a result, it is expected that the user would appropriately insert first unit 100 into socket 400. With this configuration, electronic device 1 is prevented from being carried out while first unit 100 and socket 400 are not sufficiently locked.

[1-3. Shock Dispersion Structure]

In a case where the electronic device falls in the state in which lower side 100S of first unit 100 is housed in socket 400 of second unit 200, a load of first unit 100 and a shock caused by vibrations of first unit 100 within socket 400 are concentrated on a portion of socket 400 coupled to hinge 500 and a portion nearby. Accordingly, socket 400 can be deformed. In order to suppress such deformation, electronic device 1 of the present exemplary embodiment provides a structure capable of suppressing deformation of socket 400 caused by a shock of falling or the like.

Figure 22:
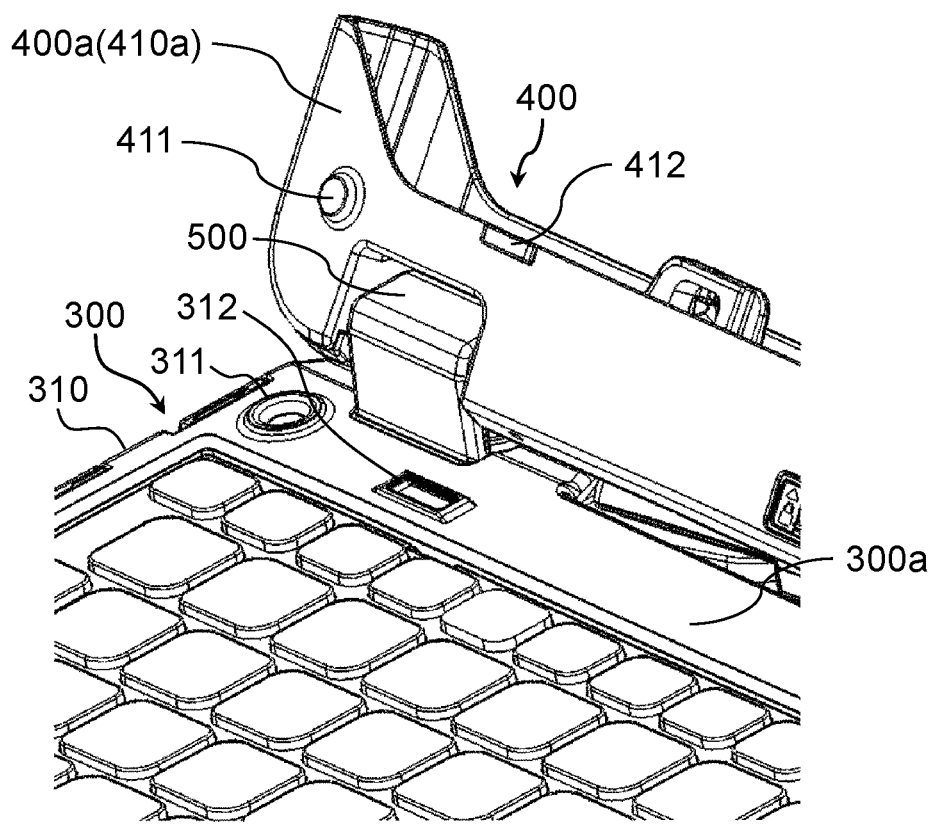
FIG. 22 is an enlarged perspective view of a portion near a hinge of the second unit.

FIG. 22 is an enlarged perspective view of a portion near hinge 500 of second unit 200. FIG. 23B is a view seen in a direction of arrow K in FIG. 2B (simplified). FIG. 24A is a sectional view taken along line 24A-24A in FIG. 23A. FIG. 24B is a sectional view taken along line 24B-24B in FIG. 23A.

As shown in FIGS. 22 and 24A, socket side first fitting part 411 is formed on principal surface 400*a* on the front side of socket 400 near hinge 500. Socket side first fitting part 411 is constituted as a projection that protrudes from principal surface 400*a* of socket 400. Socket side first fitting part 411 is formed in a circular shape in a front view. Socket side first fitting part 411 has a trapezoidal sectional shape.

Further, input unit side first fitting part 311 is formed on principal surface 300*a* of input unit 300. Input unit side first fitting part 311 is formed so as to fit with socket side first fitting part 411 of socket 400 in a state in which principal surface 300*a* of input unit 300 and principal surface 400*a* of socket 400 are substantially parallel to each other. Input unit side first fitting part 311 is constituted so as to have a recess capable of fitting to socket side first fitting part 411. Input unit side first fitting part 311 is formed in a circular shape in a front view.

As shown in FIGS. 22 and 24B, socket side second fitting part 412 is formed on principal surface 400*a* of socket 400 near hinge 500. Socket side second fitting part 412 is constituted as a projection that protrudes from principal surface 400*a* of socket 400. Socket side second fitting part 412 is formed in a rectangular shape in a front view. Socket side second fitting part 412 has a trapezoidal sectional shape.

Further, input unit side second fitting part 312 is formed on principal surface 300*a* of input unit 300. Input unit side second fitting part 312 is formed so as to fit with socket side second fitting part 412 of socket 400 in the state in which principal surface 300*a* of input unit 300 and principal surface 400*a* of socket 400 are substantially parallel to each other. Input unit side second fitting part 312 is constituted so as to have a recess capable of fitting to socket side second fitting part 412. Input unit side second fitting part 312 is formed in a rectangular shape in a front view.

Figure 23A:
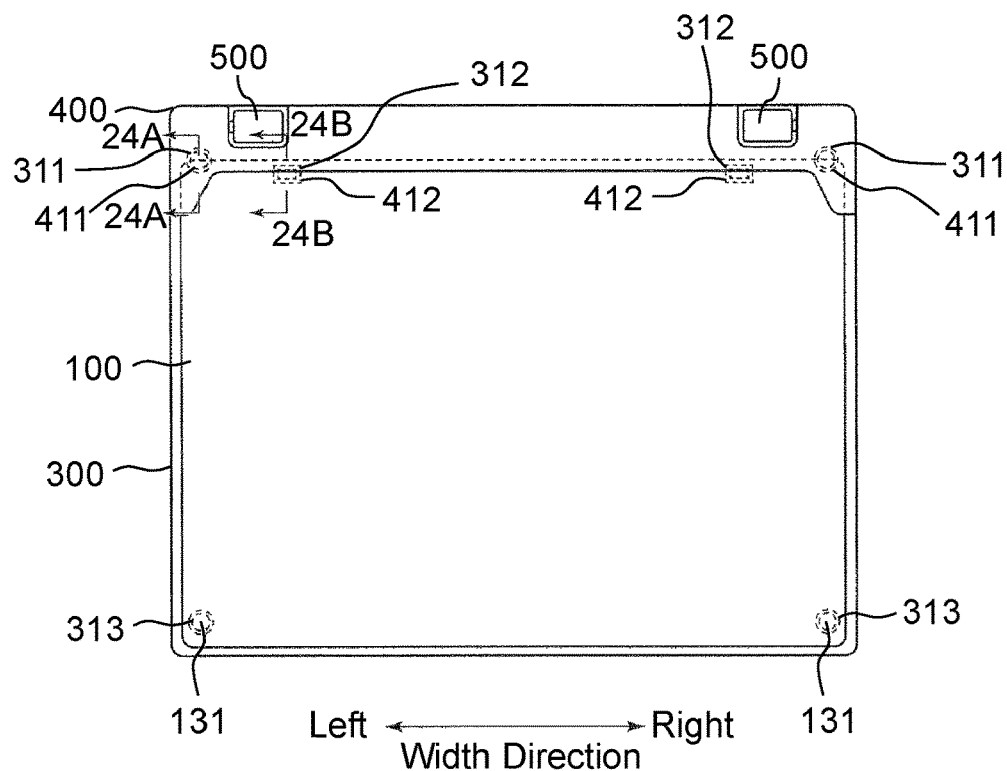
FIG. 23A is a view seen in a direction of arrow J in FIG. 2B (simplified)
Figure 23B:
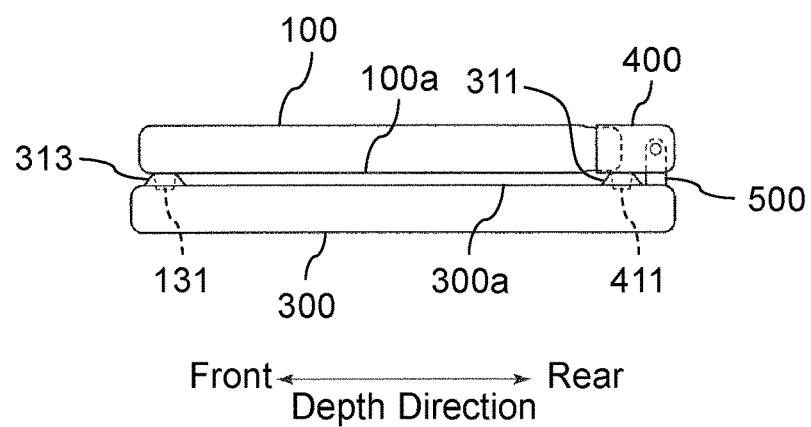
FIG. 23B is a view seen in a direction of arrow K in FIG. 2B (simplified)
Figure 24A:
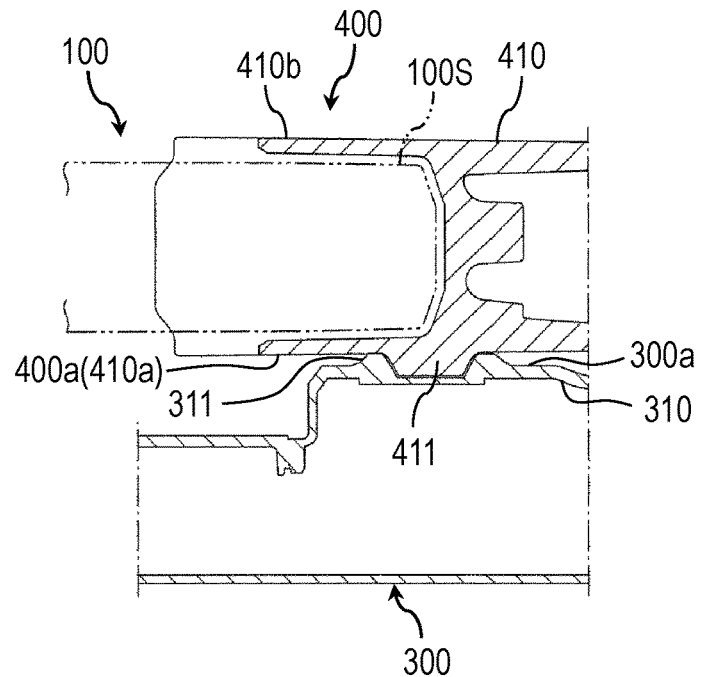
FIG. 24A is a sectional view taken along line 24A-24A in FIG. 23A.
Figure 24B:
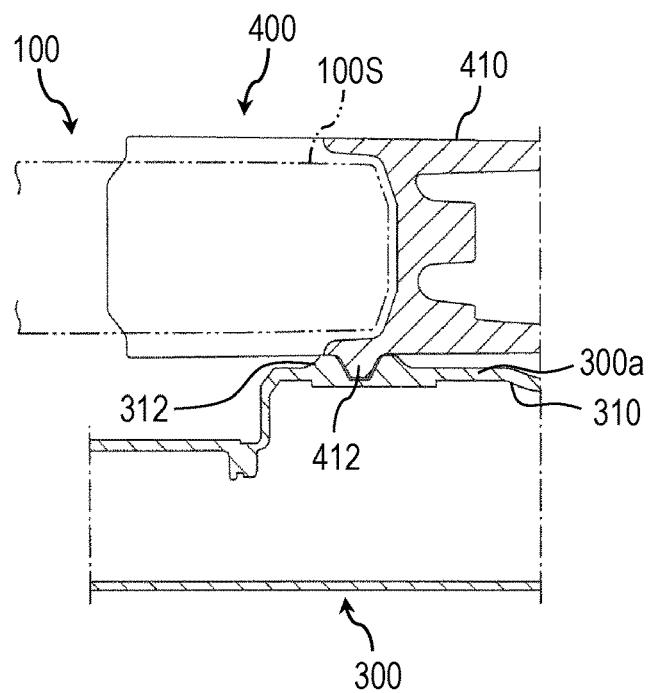
FIG. 24B is a sectional view taken along line 24B-24B in FIG. 23A.

FIG. 23A is a view seen in a direction of arrow J in FIG. 2B (simplified). As shown in FIGS. 23A and 1, socket side first fitting part 411 and socket side second fitting part 412, and input unit side first fitting part 311 and input unit side second fitting part 312 are provided corresponding to right and left hinges 500.

It should be noted that, in the present exemplary embodiment, as shown in FIG. 1, right and left first unit side fitting parts 131 are formed on principal surface 100*a* of first unit 100 near an upper side (a second predetermined side of the first unit) parallel to lower side 100S. First unit side fitting part 131 is constituted as a projection that protrudes from principal surface 100*a* of first unit 100. First unit side fitting part 131 is formed in a circular shape in a front view. First unit side fitting part 131 has a trapezoidal sectional shape.

Further, input unit side third fitting part 313 is formed on principal surface 300*a* of input unit 300. Input unit side third fitting part 313 is formed so as to fit with first unit side fitting part 131 of first unit 100 in a state in which principal surface 300*a* of input unit 300 and principal surface 100*a* of first unit 100 are substantially parallel to each other. Input unit side third fitting part 313 is constituted so as to have a recess capable of fitting to first unit side fitting part 131. Input unit side third fitting part 313 is formed in a circular shape in a front view.

(Action)

As an example, explanation is given of a case where electronic device 1 falls, for example in a state where hinge 500 side faces down, when lower side 100S of first unit 100 is housed in socket 400 of second unit 200 and first unit 100 and second unit 200 are closed.

In the present exemplary embodiment, as mentioned above, in the state in which principal surface 300a of input unit 300 and principal surface 400a of socket 400 are substantially parallel to each other, input unit side first fitting part 311 and input unit side second fitting part 312 on principal surface 300a of input unit 300 are respectively fit to socket side first fitting part 411 and socket side second fitting part 412 of socket 400. Accordingly, in the case where electronic device 1 falls in a state where lower side 100S of first unit 100 is housed in socket 400 of second unit 200, the load of first unit 100 and the shock caused by vibrations of first unit 100 within socket 400 are dispersed to second unit 200 through socket side first fitting part 411, socket side second fitting part 412, input unit side first fitting part 311, and input unit side second fitting part 312. As a result, the shock applied to the portion of socket 400 coupled to hinge 500 and the portion nearby is reduced. Hence, deformation of socket 400 caused by the shock is suppressed.

Further, in the present exemplary embodiment, the load of first unit 100 and the shock caused by vibrations of first unit 100 within socket 400 are dispersed to second unit 200 through socket side first fitting part 411, socket side second fitting part 412, input unit side first fitting part 311 and input unit side second fitting part 312. Socket side first fitting part 411 and input unit side first fitting part 311, and socket side second fitting part 412 and input unit side second fitting part 312 are respectively disposed on both sides of hinge 500. As a result, the shock applied to the portion of socket 400 coupled to hinge 500 and the portion nearby is further reduced. Hence, deformation of socket 400 caused by the shock is further suppressed.

In this case, socket 400 is supported by two hinges 500 in the present exemplary embodiment. Socket side first fitting part 411 and socket side second fitting part 412, and input unit side first fitting part 311 and input unit side second fitting part 312 are provided corresponding to two hinges 500. Accordingly, the shock applied to these portions of socket 400 coupled to respective hinges 500 and the portions nearby can be reduced. Hence, even in the case where socket 400 is supported by two hinges 500, deformation of the socket caused by the shock can be suppressed.

Moreover, in the present exemplary embodiment, the load of first unit 100 and the shock caused by vibrations of first unit 100 within socket 400 are dispersed to second unit 200 through not only socket side first fitting part 411 and input unit side first fitting part 311, and socket side second fitting part 412 and input unit side second fitting part 312 that are respectively disposed on both sides of hinge 500, but also first unit side fitting part 131 and input unit side third fitting part 313. As a result, the shock applied to the portion of socket 400 coupled to hinge 500 and the portion nearby is further reduced. Hence, deformation of socket 400 caused by the shock can be further suppressed.

Particularly, as seen in FIGS. 23A and 23B, the fitting structure is constituted in each of vicinity of four corners of principal surface 300a of input unit 300. Accordingly, relative rotation of input unit 300 and first unit 100 around an axis perpendicular to these principal surfaces 100a, 300a is suppressed. With this configuration, twisting force applied to socket 400 is also suppressed, and deformation of socket 400 can be further suppressed.

(Another Example)

In the example, the respective socket side fitting parts are constituted by the projections, and the respective input unit side fitting parts are constituted by the recesses. However, the respective socket side fitting parts may be constituted by the recesses, and the respective input unit side fitting parts may be constituted by the projections.

[1-4. Drainage Structure of Socket]

There is a request for using the electronic device having the socket outdoors. However, in a case where the electronic device having the socket is used outdoors in rainy weather or the like in a state in which first unit 100 is detached from second unit 200, water may be accumulated inside the socket. The present exemplary embodiment provides electronic device 1 capable of suppressing accumulation of water in the socket.

Figure 25A:
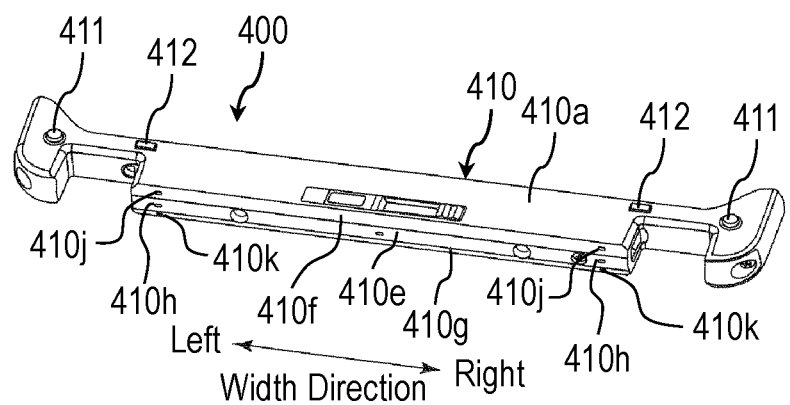
FIG. 25A is a perspective view, as seen from a bottom side, of the socket for explaining a through-hole for draining water of the socket of the electronic device according to the present exemplary embodiment.
Figure 25B:
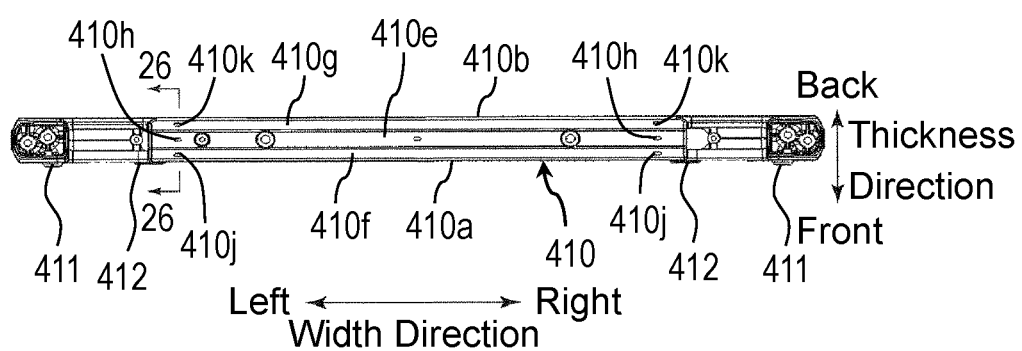
FIG. 25B is a plan view, as seen from an opening end side, of the single socket body for explaining the through-hole for draining water of the socket of the electronic device according to the present exemplary embodiment.
Figure 26:
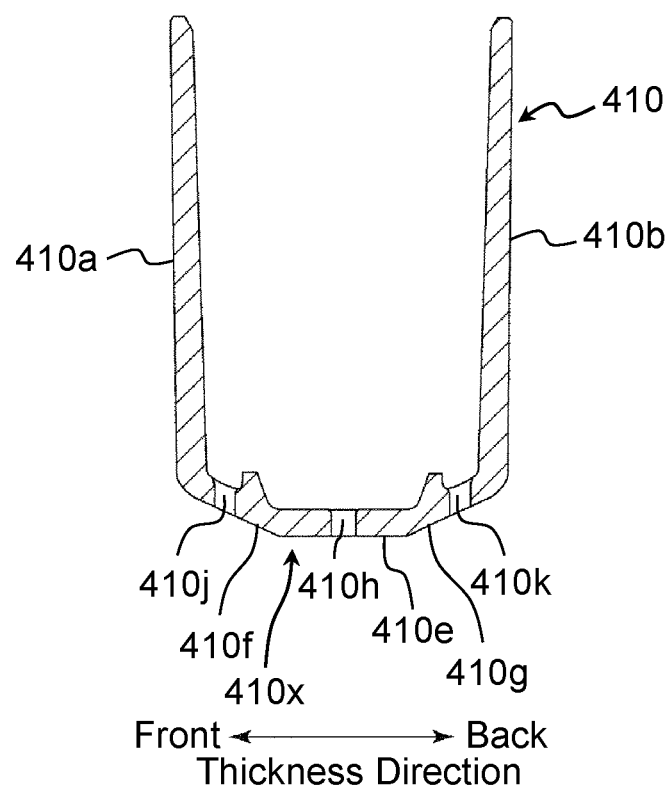
FIG. 26 is a sectional view taken along line 26-26 in FIG. 25B.

FIGS. 25A and 25B are views for explaining a through-hole for draining water of socket 400 of electronic device 1 according to the present exemplary embodiment. Specifically, FIG. 25A is a perspective view of socket 400 as seen from a bottom side, and FIG. 25B is a plan view of single socket body 410 as seen from an opening end side. FIG. 26 is a sectional view taken along line 26-26 in FIG. 25B.

As mentioned above, socket 400 has bottomed socket body 410 that opens on the side in which lower side 100S of first unit 100 is housed. Socket body 410 is provided with through-holes 410h, 410j, 410k for draining water that establish communication between an outside and an inside of socket body 410.

Specifically, socket body 410 has bottom 410x that connects first outer wall 410a and second outer wall 410b. A cross section of bottom wall 410e perpendicular to the extending direction of socket body 410 has a shape of a portion of a polygonal tube. Specifically, bottom 410x has bottom wall 410e substantially perpendicular to first outer wall 410a and second outer wall 410b, first inclined wall 410f that connects bottom wall 410e and first outer wall 410a, and second inclined wall 410g that connects bottom wall 410e and second outer wall 410b. Also, through-holes 410h, 410j, 410k for draining water are respectively provided on bottom wall 410e, first inclined wall 410f, and second inclined wall 410g. Further, through-holes 410h, 410j, 410k for draining water are provided on each of one end side and another end side in the extending direction of socket 400.

(Action)

Figure 27A:
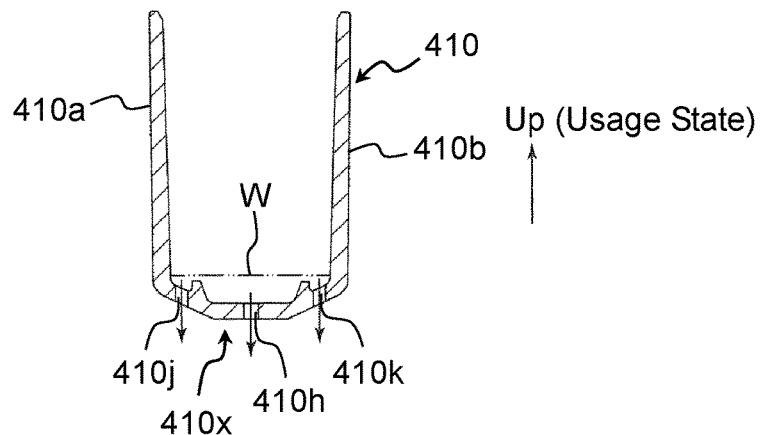
FIG. 27A is a view for explaining action by the through-hole for draining water of the socket of the electronic device according to the present exemplary embodiment.
Figure 27B:
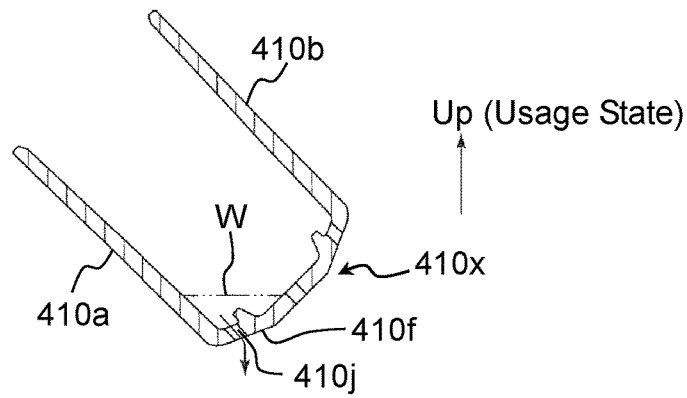
FIG. 27B is a view for explaining the action by the through-hole for draining water of the socket of the electronic device according to the present exemplary embodiment.
Figure 27C:
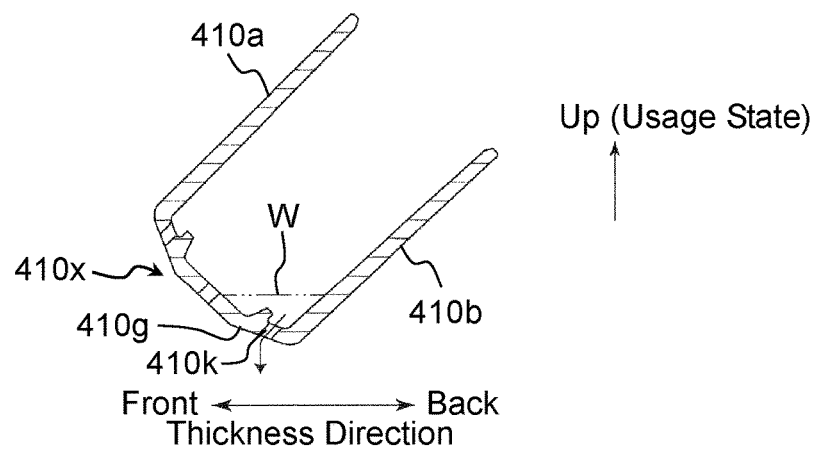
FIG. 27C is a view for explaining the action by the through-hole for draining water of the socket of the electronic device according to the present exemplary embodiment.

Action by electronic device 1 in the present exemplary embodiment is explained. FIGS. 27A, 27B, and 27C are views for explaining the action by through-holes 410h, 410j, 410k for draining water of socket 400 of electronic device 1 according to the present exemplary embodiment. It should be noted that illustration of various members, such as the aforementioned lock mechanism, housed in socket body 410 is omitted.

In a case where electronic device 1 is used outdoors in rainy weather or the like in a state in which first unit 100 is detached from second unit 200, water may enter inside socket 400 through a gap between socket body 410 and the respective members that configure socket 400. In this case, for example, as shown in FIG. 27A, when the up and down direction of socket body 410 is substantially vertical, water W entered inside socket 400 can be discharged to outside of socket 400 via all through-holes 410h, 410j, 410k.

On the other hand, for example, as shown in FIG. 27B, when the up and down direction of socket body 410 is inclined toward the front surface side in the thickness direction with respect to a substantially vertical direction, water W entered inside socket 400 can be discharged to the outside of socket 400 via through-hole 410*j* on first inclined wall 410*f*.

Meanwhile, for example, as shown in FIG. 27C, when the up and down direction of socket body 410 is inclined toward the back surface side in the thickness direction with respect to the substantially vertical direction, water W entered inside socket 400 can be drained to outside of socket 400 via through-hole 410*k* on second inclined wall 410*g*.

In this way, in the present exemplary embodiment, even in a case where socket body 410 is inclined with respect to the vertical direction, the water inside socket 400 is discharged through any of a plurality of through-holes 410*h*, 410*j*, 410*k*. Hence, even in a case where water enters inside socket body 410 while the user keeps socket 400 inclined, drainage can be performed appropriately.

Further, in the present exemplary embodiment, through-holes 410*h*, 410*j*, 410*k* are provided on each of the one end side and the other end side in the extending direction of socket 400. Accordingly, even in a case where electronic device 1 is used in a state in which heights on the one end side and the other end side in the extending direction of socket 400 are different, for example, second unit 200 of electronic device 1 is not used in a horizontal state, drainage can be performed via the through-holes on either the one end side and the other end side located at a lower position. Hence, even in a case where input unit 300 (second unit 200) is not used in the horizontal state, drainage can be performed appropriately.

(Another Example)

In the example, the cross section of bottom wall 410*e* perpendicular to the extending direction of socket body 410 has the shape of the portion of the polygonal tube, and the plurality of through-holes 410*h*, 410*j*, 410*k* are provided on bottom wall 410*e* separately in the direction perpendicular to the extending direction of socket body 410. However, the present disclosure is not limited to the configuration. For example, the cross section of bottom wall 410*e* perpendicular to the extending direction of socket body 410 may have an arc shape, and the plurality of through-holes may be provided on bottom wall 410*e* separately in the direction perpendicular to the extending direction of socket body 410.

[1-5. Drainage Structure of Antenna Connector]

There is a request for connecting an external antenna to the electronic device having the configuration. In this case, it is necessary to provide a connector for external antenna connection (hereinafter appropriately referred to as the "antenna connector") in the electronic device. In a case where the antenna connector is provided in socket 400 such that a connection end is directed upward in an exposed state, when the electronic device is used outdoors in rainy weather or the like in a state in which the first unit is detached, water can be accumulated inside the antenna connector of socket 400. The present exemplary embodiment provides the electronic device capable of suppressing accumulation of water in socket 400. The present exemplary embodiment provides an antenna connector in which water is hardly accumulated and electronic device 1 provided with the antenna connector.

As shown in FIG. 7A, antenna connector 600 is mounted to mounting hole 431*x* formed at support member 431 of socket 400. Antenna connector 600 can be connected to antenna connector 140 of first unit 100 (see FIG. 4).

Figure 28A:
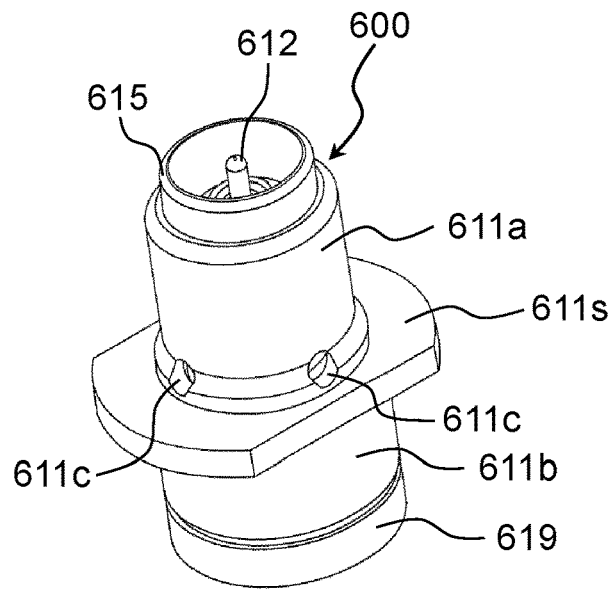
FIG. 28A is a perspective view, as seen from a connection end side, of an antenna connector in the electronic device according to the present exemplary embodiment.
Figure 28B:
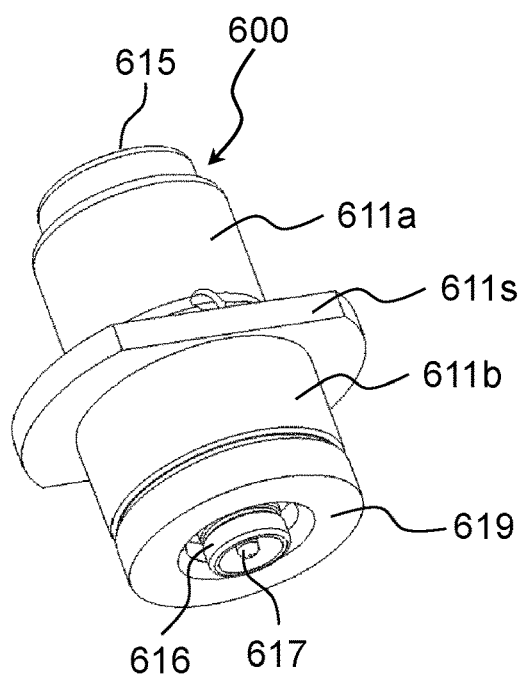
FIG. 28B is a perspective view, as seen from a base side, of the antenna connector in the electronic device according to the present exemplary embodiment.
Figure 29:
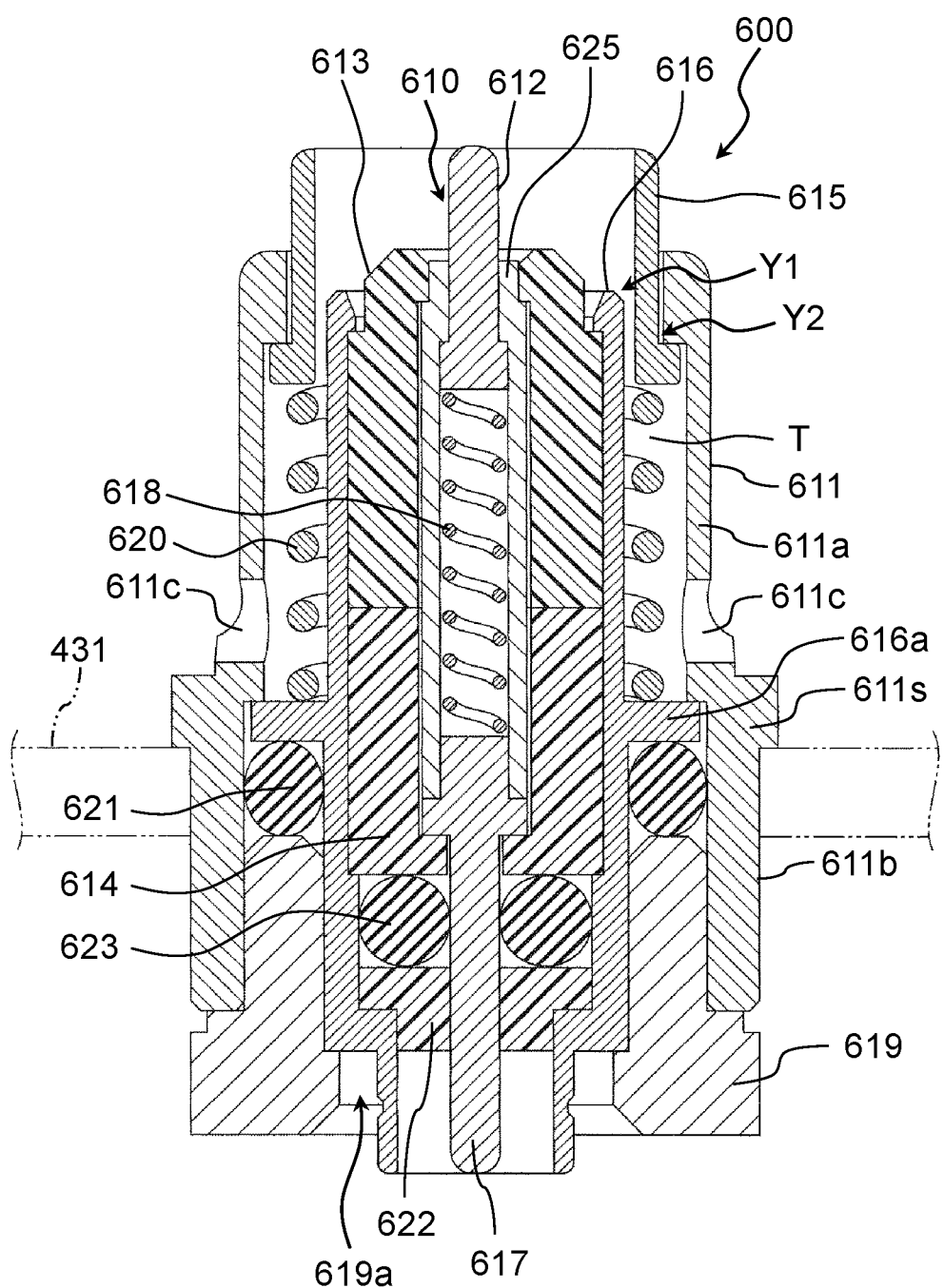
FIG. 29 is a longitudinal sectional view of the antenna connector in the electronic device according to the present exemplary embodiment.
Figure 30:
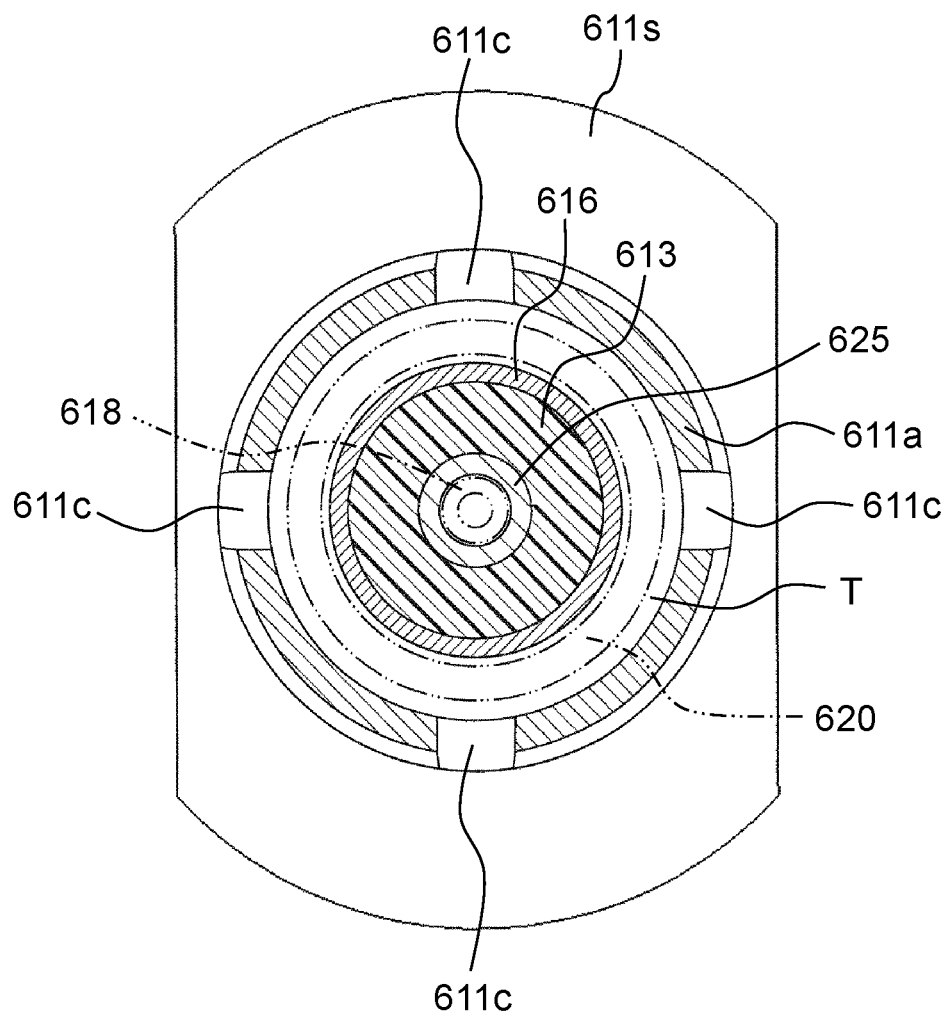
FIG. 30 is a cross sectional view of the antenna connector in the electronic device according to the present exemplary embodiment.

FIG. 28A is a perspective view, as seen from a connection end side, of antenna connector 600 in electronic device 1 according to the present exemplary embodiment. FIG. 28B is a perspective view, as seen from base 611*b* side, of antenna connector 600 in electronic device 1 according to the present exemplary embodiment. FIG. 29 is a longitudinal sectional view of antenna connector 600 in electronic device 1 according to the present exemplary embodiment. FIG. 30 is a cross sectional view of antenna connector 600 in electronic device 1 according to the present exemplary embodiment.

Antenna connector 600 has tubular case 611. External contact part 611*a* is formed on one end side of case 611, base 611*b* for mounting antenna connector 600 to socket 400 of the electronic device is formed on another end side, and mounting flange 611*s* is formed between external contact part 611*a* and base 611*b*.

Case 611 houses inside, from a center side, shaft-shaped center contact part 610, tubular insulators 613, 614, 622, O-ring 623, support cylinder 616, protection cylinder 615, spring 620, O-ring 621, and base 619.

Center contact part 610 has contact support cylinder 625, movable center contact 612, spring 618, and fixed center contact 617. Movable center contact 612 is housed in contact support cylinder 625 so as to be movable in the axial direction, and is biased to outside by spring 618. Fixed center contact 617 is fixed to a lower end of contact support cylinder 625.

Support cylinder 616 supports center contact part 610 via insulators 613, 614, 622. Waterproof O-ring 623 is disposed between insulators 613, 614 and insulator 622 in the axial direction.

Ring-shaped protrusion 616*a* is provided at an axial direction intermediate part of support cylinder 616.

Protection cylinder 615 is supported by case 611 so as to be movable in the axial direction, and is biased to the outside by spring 620.

Base stand 619 has through-hole 619*a* penetrating in the axial direction. One end side of support cylinder 616 is fitted into through-hole 619*a*. Base 611*b* of case 611 is fitted to an outer peripheral surface of base stand 619. Waterproof O-ring 621 is disposed between an inner end of base stand 619, base 611*b* of case 611, and protrusion 616*a* of support cylinder 616.

Here, in the present exemplary embodiment, space T is formed between support cylinder 616 that houses insulators 613, 614, 622 and external contact part 611*a* of case 611. Space T is formed to dispose above-described spring 620. Further, gaps Y1, Y2 are respectively formed between protection cylinder 615 and support cylinder 616 and between protection cylinder 615 and external contact part 611*a* in a radial direction. Gaps Y1, Y2 are formed to allow movement of protection cylinder 615 in the axial direction.

In such a configuration, as shown in FIG. 29, when external contact part 611*a* side of antenna connector 600 is directed upward in the vertical direction, water can enter into space T through gaps Y1, Y2 during rainfall or the like. When the water enters into space T, an electric impedance characteristic of antenna connector 600 may be changed to a rated characteristic. The change in the characteristic may have an adverse influence on transmission/reception of a radio signal. Therefore, in the present exemplary embodiment, through-hole 611*c* for draining water is formed at external contact part 611*a* of case 611 to drain entered water.

Specifically, through-hole 611*c* is formed at external contact part 611*a* near base 611*b*. Through-hole 611*c* is formed to drain the water entered into space T while an amount of water is small.

Further, a plurality of through-holes 611*c* are formed at external contact part 611*a* separately in a circumferential direction. Here, in electronic device 1 of the present exemplary embodiment, antenna connector 600 is mounted to rotatable socket 400. Accordingly, when socket 400 is rotated, antenna connector 600 is also inclined to the vertical direction. Further, mounting of electronic device 1 is not limited to a horizontal surface. In this case as well, antenna connector 600 is inclined with respect to the vertical direction. Therefore, in the present exemplary embodiment, even when antenna connector 600 is inclined with respect to the vertical direction, water is drained through any of through-holes 611c.

(Action)

Figure 31:
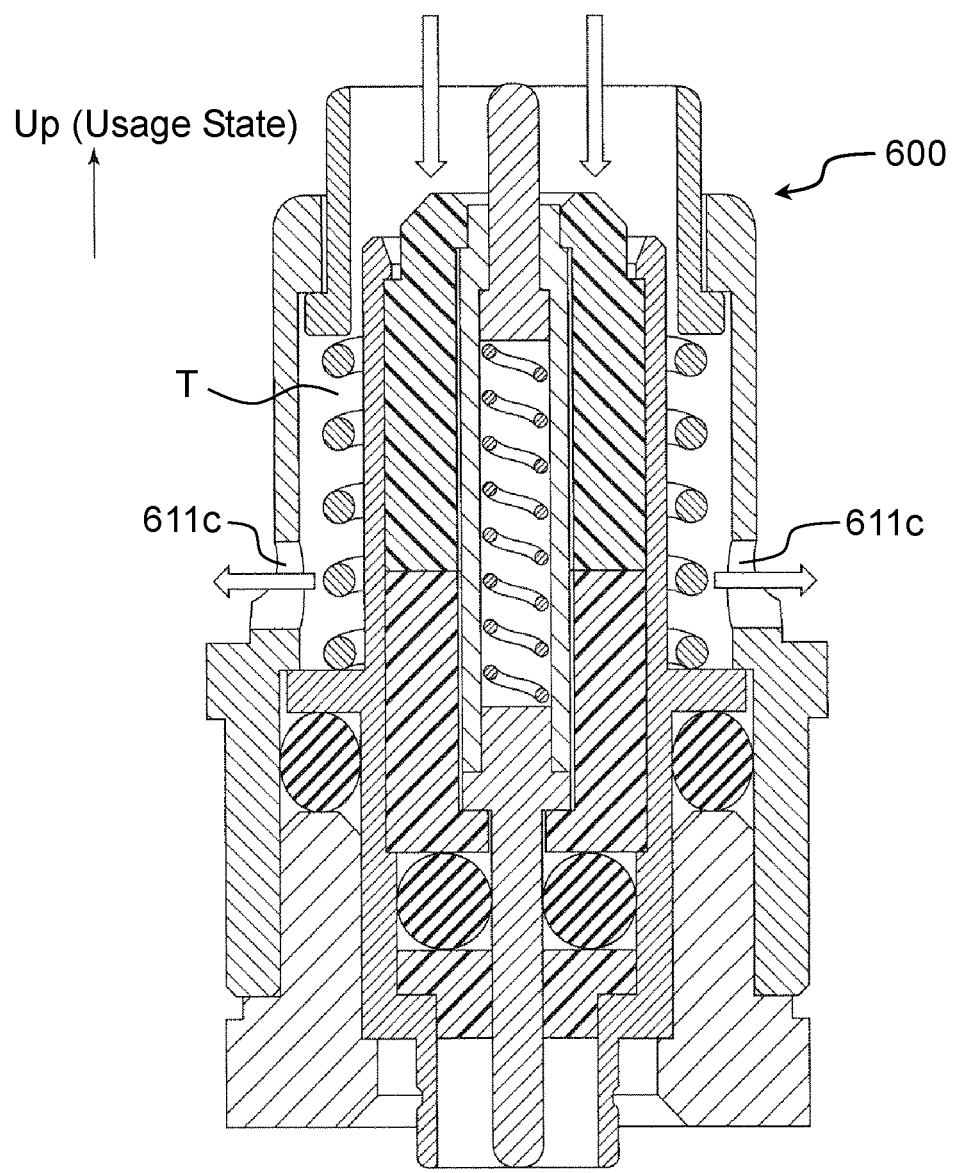
FIG. 31 is a view for explaining action of the antenna connector in the electronic device according to the present exemplary embodiment.

FIG. 31 is a view for explaining action of antenna connector 600 in electronic device 1 according to the present exemplary embodiment. It is assumed that rainfall or the like occurs when external contact part 611a side of antenna connector 600 is directed upward in the vertical direction, and rainwater enters into space T through gaps Y1, Y2. In this case, as shown by arrows, the water is drained from space T to the outside of external contact part 611a via through-holes 611c for draining water.

Further, in a case where antenna connector 600 is inclined with respect to the vertical direction, the water within space T between external contact part 611a and insulators 613, 614, 622 is discharged via through-hole 611c located at a lowest position out of the plurality of through-holes 611c for draining water. Hence, even in the case where second unit 200 is not used in the horizontal state, drainage can be performed appropriately.

Further, since through-hole 611c is formed at external contact part 611a near base 611b, accumulation of water within space T between external contact part 611a and insulators 613, 614, 622 is suppressed as much as possible.

As described above, according to antenna connector 600 of the present exemplary embodiment, even in a case where an angle of socket 400 or an angle of a mounting surface is changed, the water within space T between external contact part 611a and insulators 613, 614, 622 is appropriately discharged. As a result, the electric impedance characteristic of antenna connector 600 can be properly maintained at the rated characteristic.

(Another Example)

In the exemplary embodiment, four through-holes 611c are formed separately in the circumferential direction. However, in the present disclosure, one to three or five or more through-holes 611c may be formed. Further, the plurality of through-holes 611c may be formed separately in the axial direction of antenna connector 600. Further, a shape of through-hole 611c can be any shape including an elliptical shape, a polygonal shape, and the like instead of the circular shape.

[2. Effects]

[2-1. Lock Mechanism]

Electronic device 1 of the present exemplary embodiment includes first unit 100 having a first electronic member and second unit 200 having a second electronic member, and is constructed such that first unit 100 and second unit 200 are detachable.

First unit 100 has first engageable part 110 and second engageable part 110 provided separately from each other.

Second unit 200 has the lock mechanism capable of locking first unit 100 in an attached state.

The lock mechanism includes operating member 420, first engaging member 443, second engaging member 443, and drive mechanism 430. Operating member 420 is movable between the first position and the second position. First engaging member 443 is engageable with first engageable part 110 and movable to the first axial center direction position (a first predetermined position). Second engaging member 443 is engageable with second engageable part 110 and movable to the first axial center direction position (a second predetermined position). Drive mechanism 430 engages first and second engaging members 443 and first and second engageable parts 110 when operating member 420 is located at the first position. Drive mechanism 430 releases the engagement of first and second engaging members 443 and first and second engageable parts 110 when operating member 420 is located at the second position.

When operating member 420 is located at the second position, in a case where first engaging member 443 and second engaging member 443 are respectively moved to the first axial center direction position (the first predetermined position) and the first axial center direction position (the second predetermined position), drive mechanism 430 moves operating member 420 from the second position to the first position. In a case where at least one of first engaging member 443 and second engaging member 443 is not moved to the first axial center direction position (the first predetermined position) or the first axial center direction position (the second predetermined position), drive mechanism 430 does not move operating member 420 from the second position to the first position.

According to the present exemplary embodiment, when first unit 100 is attached to socket 400 of second unit 200 while operating member 420 is located at the second position, in a case where both of engaging members 443 are moved to the first axial center direction positions, operating member 420 is moved from the second position to the first position. In a case where at least one of two engaging members 443 is not moved to the first axial center direction position, operating member 420 is not moved from the second position to the first position. Therefore, the user can visually recognize that first unit 100 is not locked to second unit 200 based on a fact that operating member 420 is not moved to the first position side. As a result, it is expected that the user would appropriately attach first unit 100 to second unit 200. With this configuration, electronic device 1 is prevented from being carried while first unit 100 and second unit 200 are insufficiently locked.

In the electronic device of the present exemplary embodiment, engaging member 443 is provided in second unit 200 so as to protrude to the outside from the upper surface of base plate 431a of second unit 200 (the predetermined surface of the second unit). Engaging member 443 is rotatable around rotating axial center RC perpendicular to the upper surface of base plate 431a.

Operating member 420 is linearly movable between the first position and the second position in the predetermined direction in second unit 200.

Drive mechanism 430 further has first spring 434 (a second biasing member) that biases operating member 420 to the first position side in the predetermined direction.

Drive mechanism 430 rotates each engaging member 443 to the first rotational position when operating member 420 is moved to the first position. Drive mechanism 430 rotates each engaging member 443 to the second rotational position when operating member 420 is moved to the second position. In this manner, drive mechanism 430 converts the linear movement of operating member 420 between the first position and the second position into the rotation of each engaging member 443 between the first rotational position and the second rotational position.

Each engaging member 443 has the pair of engaging projections 443a across rotating axial center RC.

Each engageable part 110 has the pair of engagement recesses 121b. The pair of engagement recesses 121b engages with the pair of engaging projections 443a when each engaging member 443 is located at the first rotational position. The engagement with the pair of engaging projections 443a is released when each engaging member 443 is located at the second rotational position.

Each engaging member 443 is configured so as to be movable between the first axial center direction position and the second axial center direction position in the rotating axial center direction of each engaging member 443. Each engaging member 443 further has fitting projection 443j at the second axial center direction position in the rotating axial center direction. Each fitting projection 443j is fitted into second fitting recess 431f of second unit 200 and regulates rotation of engaging member 443 when each engaging member 443 is located at the second axial center direction position and at the second rotational position. Each fitting projection 443j releases the fitting into second fitting recess 431f and allows rotation of engaging member 443 when each engaging member 443 is located at the first axial center direction position.

Drive mechanism 430 further has second spring 451 that biases each engaging member 443 to the second axial center direction position side in the rotating axial center direction so as to correspond to each engaging member 443. When first unit 100 is attached to second unit 200, rotating shaft 443b of each engaging member 443 abuts on plane 123b (a predetermined area) of engageable part 110 of first unit 100, and engaging member 443 is moved to the first axial center direction position against the biasing force of second spring 451.

According to the present exemplary embodiment, engaging member 443 can be rotated around rotating axial center RC by an operation of operating member 420, and further, the pair of engaging projections 443a provided across rotating axial center RC can be engaged with the pair of engagement recesses 121b of engageable part 110. In this way, the present exemplary embodiment employs the structure in which the pair of engaging projections 443a provided across rotating axial center RC in engaging member 443 is rotated and engaged with the pair of engagement recesses 121b of engageable part 110. Accordingly, in a state in which engaging projections 443a are engaged with engagement recesses 121b, both engaging projections 443a and engagement recesses 121b are relatively moved due to application of some force to first unit 100 in any direction of a front and rear direction, a right and left direction, and an up and down direction. As a result, strength of engagement between one engaging projection 443a and one engagement recess 121b is relaxed. Even in this case, strength of engagement between other engaging projection 443a and other engagement recess 121b is enhanced. In other words, even in a case where some force is applied to first unit 100 in any direction of the front and rear direction, the right and left direction, and the up and down direction, strength of engagement of the lock mechanism as a whole is kept almost constant. Therefore, even in a case where force is applied to first unit 100 in any direction, an engaged state can be stabilized.

Further, when first unit 100 is attached to socket 400 of second unit 200 while operating member 420 is located at the second position, in a case where both of engaging members 443 are moved to the first axial center direction positions, operating member 420 is moved from the second position to the first position. In a case where at least one of two engaging members 443 is not moved to the first axial center direction position, operating member 420 is not moved from the second position to the first position. Such movement can be realized by using up and down motions of engaging members 443.

In the present exemplary embodiment, engaging member 443 has engaging shaft 443g provided at a position different from rotating axial center RC in the radial direction and extending parallel to rotating axial center RC. Drive mechanism 430 has coupling member 433 fixed to operating member 420 and supported in socket body 410 (a predetermined casing) of second unit 200 so as to be movable in the moving direction of operating member 420. Coupling member 433 includes groove 433a (433b), with which engaging shaft 443g of engaging member 443 is engaged relatively movably.

Groove 433a (433b) is formed in a meandering manner. When operating member 420 is moved to the first position, groove 433a (433b) rotates engaging member 443 around rotating axial center RC to the first rotational position. When operating member 420 is moved to the second position, groove 433a (433b) rotates engaging member 443 around rotating axial center RC to the second rotational position.

With this simple configuration, the linear movement of operating member 420 can be converted into the rotational movement of engaging member 443.

In the present exemplary embodiment, second unit 200 is provided with spring 451 (a third biasing member) that biases first unit 100 attached to second unit 200 to the second axial center direction position side in rotating axial center RC direction of each engaging member 443.

With this configuration, each engaging member 443 can be biased to the second axial center direction position side in rotating axial center RC direction. Accordingly, the disengaged state can be maintained.

In the present exemplary embodiment, spring 451 (the third biasing member) is connector pin 461 (the pin) of connector 460 for giving and receiving an electric signal and/or electric power between second unit 200 and first unit 100.

With this configuration, the biasing member can be configured by using connector 460.

In the present exemplary embodiment, second unit 200 includes input unit 300 having keyboard 301, socket 400 capable of housing lower side 100S of first unit 100, and hinge 500 that couples rear side 300S (the predetermined side) of input unit 300 to lower side 400S (the predetermined side) of socket 400 such that input unit 300 and socket 400 are relatively rotatable.

The upper surface of base plate 431a of second unit 200 (the predetermined surface of the second unit) is a surface of socket 400 that faces lower side 100S of first unit 100 when lower side 100S of first unit 100 is housed in socket 400.

With this configuration, first unit 100 and second unit 200 are relatively movable, and the aforementioned effects are achieved in such electronic device 1.

In the present exemplary embodiment, drive mechanism 430 is housed in an internal space of socket 400.

With this configuration, drive mechanism 430 can be disposed by effectively using the internal space of socket 400.

In the present exemplary embodiment, first unit 100 is the tablet type computer.

In the tablet type computer, it is often requested that input unit 300 having the keyboard and the like is detachable to enhance efficiency of character input or the like. Further, the tablet type computer incorporates a central processing unit (CPU), a volatile storage (RAM), a nonvolatile storage (ROM, SSD, or the like), a battery, and the like, thereby increasing weight. According to the present exemplary embodiment, even in a case where first unit 100 is a tablet type computer, the strongly lockable lock mechanism can be provided, and the engaging state can be stabilized in the lock mechanism that locks the tablet type computer.

[2-2. Shock Dispersion Structure]

Electronic device 1 of the present exemplary embodiment includes first unit 100 having the display and second unit 200 having the input part, and is constructed such that first unit 100 and second unit 200 are detachable.

Second unit 200 includes input unit 300 having principal surface 300a provided with the input part, socket 400 capable of housing lower side 100S of first unit 100, and hinge 500 that couples rear side 300S (the predetermined side) of input unit 300 to lower side 400S (the predetermined side) of socket 400 such that input unit 300 and socket 400 are relatively rotatable. Principal surface 300a of input unit 300 and principal surface 400a of socket 400 are substantially parallel to each other by relatively rotating input unit 300 and socket 400. Socket side first fitting part 411 and socket side second fitting part 412, which constitute one shape of a recess and a projection, are formed on principal surface 400a of socket 400 near hinge 500. Input unit side first fitting part 311 and input unit side second fitting part 312, which constitute another shape of the recess and the projection, are formed on principal surface 300a of input unit 300. Input unit side first fitting part 311 and input unit side second fitting part 312 are formed so as to fit to socket side first fitting part 411 and socket side second fitting part 412 of socket 400 in the state in which principal surface 300a of input unit 300 and principal surface 400a of socket 400 are substantially parallel to each other.

According to the present exemplary embodiment, in the state in which principal surface 300a of input unit 300 and principal surface 400a of socket 400 are substantially parallel to each other, input unit side first fitting part 311 and input unit side second fitting part 312 on principal surface 300a of input unit 300 are respectively fit to socket side first fitting part 411 and socket side second fitting part 412 of socket 400. Accordingly, in a case where electronic device 1 falls in the state where lower side 100S of first unit 100 is housed in socket 400 of second unit 200, the load of first unit 100 and the shock caused by vibrations of first unit 100 within socket 400 can be dispersed to second unit 200 through socket side first fitting part 411 and socket side second fitting part 412, and input unit side first fitting part 311 and input unit side second fitting part 312. As a result, the shock applied to the portion of socket 400 coupled to hinge 500 and the portion nearby can be reduced. Hence, deformation of socket 400 caused by the shock can be suppressed.

In the present exemplary embodiment, socket side first fitting part 411 and socket side second fitting part 412 are respectively formed on either side of hinge 500 in the rotating axial center direction of hinge 500 on principal surface 400a of socket 400. Input unit side first fitting parts 311 and input unit side second fitting parts 312 are formed, on principal surface 300a of input unit 300, so as to fit to socket side first fitting parts 411 and socket side second fitting parts 412 of socket 400 in the state in which principal surface 300a of input unit 300 and principal surface 400a of socket 400 are substantially parallel to each other.

With this configuration, in a case where electronic device 1 falls when lower side 100S of first unit 100 is housed in socket 400 of second unit 200, the load of first unit 100 and the shock caused by vibrations of first unit 100 within socket 400 can be dispersed to second unit 200 through socket side first fitting part 411 and socket side second fitting part 412, and input unit side first fitting part 311 and input unit side second fitting part 312 respectively formed on either side of hinge 500. As a result, the shock applied to the portion of socket 400 coupled to hinge 500 and the portion nearby can be further reduced. Hence, deformation of socket 400 caused by the shock can be further suppressed.

In the present exemplary embodiment, two hinges 500 are provided separately in input unit 300 in the width direction of the device. Socket side first fitting part 411 and socket side second fitting part 412, and input unit side first fitting part 311 and input unit side second fitting part 312 are provided corresponding to each hinge 500.

With this configuration, in a case where socket 400 is supported by two hinges 500, the shock applied to the portion of socket 400 coupled to each hinge 500 and the portion nearby can be reduced. Hence, even in the case where socket 400 is supported by two hinges 500, deformation of socket 400 caused by the shock can be suppressed.

In the present exemplary embodiment, first unit 100 includes principal surface 100a provided with the display. Principal surface 100a of first unit 100 and principal surface 300a of input unit 300 are substantially parallel to each other by relatively rotating input unit 300 and socket 400 in the state in which lower side 100S of first unit 100 is housed in socket 400. First unit side fitting part 131, which constitutes one shape of a second recess and a second projection, is formed on principal surface 100a of first unit 100 near the upper side (the second predetermined side) parallel to lower side 100S. Input unit side third fitting part 313, which constitutes another shape of the second recess and the second projection, is formed on principal surface 300a of input unit 300 so as to fit to first unit side fitting part 131 of first unit 100 in the state in which principal surface 100a of first unit 100 and principal surface 300a of input unit 300 are substantially parallel to each other.

With this configuration, in the case where electronic device 1 falls when lower side 100S of first unit 100 is housed in socket 400 of second unit 200, the load of first unit 100 and the shock caused by vibrations of first unit 100 within socket 400 can be dispersed to second unit 200 through not only socket side first fitting part 411 and socket side second fitting part 412, and input unit side first fitting part 311 and input unit side second fitting part 312 that are respectively disposed on either side of hinge 500, but also first unit side fitting part 131 and input unit side third fitting part 313. As a result, the shock applied to the portion of socket 400 coupled to hinge 500 and the portion nearby can be further reduced. Hence, deformation of socket 400 caused by the shock can be further suppressed.

[2-3. Drainage Structure of Socket]

Electronic device 1 of the present exemplary embodiment includes first unit 100 having display 101 and second unit 200 having the input part, and is constructed such that first unit 100 and second unit 200 are detachable.

Second unit 200 includes socket 400 capable of housing lower side 100S of first unit 100. Socket 400 has bottomed socket body 410 that opens on the side in which lower side 100S (the predetermined side) of first unit 100 is housed. Socket body 410 is provided with through-holes 410h, 410j, 410k for draining water that establish communication between the outside and the inside of socket body 410.

According to the present exemplary embodiment, even in a case where water enters inside bottomed socket body 410 included in electronic device 1, the entered water can be discharged to the outside of socket body 410 via through-holes 410*h*, 410*j*, 410*k* for draining water. With this configuration, accumulation of water inside socket body 410 can be suppressed.

In the present exemplary embodiment, second unit 200 includes socket 400, input unit 300 provided with the input part, and hinge 500 that couples rear side 300S (the predetermined side) of input unit 300 to lower side 400S (the predetermined side) of socket 400 such that input unit 300 and socket 400 are relatively rotatable. Socket body 410 is extended in the direction substantially parallel to the rotating axial center of hinge 500. Socket body 410 has first outer wall 410*a* substantially parallel to the rotating axial center, second outer wall 410*b* substantially parallel to first outer wall 410*a*, and bottom wall 410*e* that connects first outer wall 410*a* and second outer wall 410*b*. The plurality of through-holes 410*h*, 410*j*, 410*k* are provided separately on bottom wall 410*e* in the direction perpendicular to the extending direction of socket body 410.

With this configuration, even in a case where input unit 300 and socket 400 are relatively rotatable and socket 400 is not perpendicular to but is inclined with respect to a horizontal direction, the water within socket 400 is drained through any of the plurality of through-holes 410*h*, 410*j*, 410*k*. Hence, even in a case where water enters inside socket body 410 while the user keeps socket 400 inclined, drainage can be performed appropriately.

In the present exemplary embodiment, the cross section of bottom wall 410*e* perpendicular to the extending direction of socket body 410 has the shape of the portion of the polygonal tube.

With this configuration, even in a case where first unit 100 is rotated at various angles, drainage can be performed appropriately.

In the present exemplary embodiment, socket body 410 is extended in the direction substantially parallel to the rotating axial center of hinge 500. Through-holes 410*h*, 410*j*, 410*k* are provided on each of the one end side and the other end side in the extending direction of socket 400.

With this configuration, in other words, even in a case where electronic device 1 is used in a state in which heights on the one end side and the other end side in the extending direction of socket 400 are different, for example, second unit 200 is not used in the horizontal state, drainage can be performed through the through-holes on either the one end side and the other end side located at the lower position. Hence, even in the case where second unit 200 is not used in the horizontal state, drainage can be performed appropriately.

It should be noted that, in the exemplary embodiment, the cross section of bottom wall 410*e* perpendicular to the extending direction of socket body 410 has the shape of the portion of the polygonal tube, and that the plurality of through-holes 410*h*, 410*j*, 410*k* are provided on bottom wall 410*e* separately in the direction perpendicular to the extending direction of socket body 410. However, the present disclosure is not limited to the configuration. For example, the cross section of bottom wall 410*e* perpendicular to the extending direction of socket body 410 may have an arc shape, and a plurality of through-holes may be provided on bottom wall 410*e* separately in the direction perpendicular to the extending direction of socket body 410.

[2-4. Drainage Structure of Antenna Connector]

Antenna connector 600 of the present exemplary embodiment has tubular case 611 having base 611*b* on the one end side in the axial direction and cylindrical external contact part 611*a* on the other end side in the axial direction, shaft-shaped center contact part 610 disposed on a center axis of external contact part 611*a*, and tubular insulators 613, 614, 622 disposed between external contact part 611*a* and center contact part 610. Space T is formed between external contact part 611*a* and insulators 613, 614, 622. O-ring 621 (a sealing member) is disposed between base 611*b* and insulators 613, 614, 622. Through-hole 611*c* for draining water that establishes communication between space T and the outside of external contact part 611*a* is formed at external contact part 611*a*.

According to the present exemplary embodiment, external contact part 611*a* of antenna connector 600 has through-hole 611*c* for draining water that establishes communication between space T formed between external contact part 611*a* and insulators 613, 614, 622 and the outside of external contact part 611*a*. Accordingly, even in a case where water enters into space T, the entered water is discharged via through-hole 611*c* for draining water. As a result, the electric characteristic of antenna connector 600 can be favorably maintained. Further, in electronic device 1, the electric signal can be favorably obtained via antenna connector 600.

In the present exemplary embodiment, the plurality of through-holes 611*c* are formed at external contact part 611*a* separately in the circumferential direction.

With this configuration, even in a case where electronic device 1 is used while the axial direction of antenna connector 600 is inclined with respect to the vertical direction, for example, even in the case where second unit 200 is not used in the horizontal state, the water within space T between external contact part 611*a* and insulators 613, 614, 622 is discharged via through-hole 611*c* located at the lowest position out of the plurality of through-holes 611*c* for draining water. Hence, even in the case where second unit 200 is not used in the horizontal state, drainage can be performed appropriately.

In the present exemplary embodiment, through-hole 611*c* is formed at external contact part 611*a* near base 611*b*.

With this configuration, accumulation of water within space T between external contact part 611*a* and insulators 613, 614, 622 is suppressed as much as possible.

Electronic device 1 of the present exemplary embodiment includes first unit 100 having the display and second unit 200 having the input part. Electronic device 1 is constructed such that first unit 100 and second unit 200 are detachable. Second unit 200 includes socket 400 capable of housing lower side 100S (the predetermined side) of first unit 100. Socket 400 includes antenna connector 600 of the present disclosure on a surface of a portion in which first unit 100 is housed.

With this configuration, in electronic device 1 having the configuration, when rainfall or the like occurs in a state in which first unit 100 is not attached to socket 400, rainwater can enter into space T between external contact part 611*a* and insulators 613, 614, 622 of antenna connector 600. However, the water within space T is properly drained in this case.

In the present exemplary embodiment, in a usage state where the surface of recess 400*y* (the portion), in which first unit 100 is housed, of socket 400 is directed upward, external contact part 611*a* is located above base 611*b* in antenna connector 600.

In the usage state where the surface of recess 400*y* (the portion), in which first unit 100 is housed, of socket 400 is directed upward, when rainfall or the like occurs in a state in which external contact part 611*a* is located above base 611*b*, water easily enters into space T between external contact part 611*a* and insulators 613, 614, 622 of antenna connector 600. However, the water within space T is properly drained in this case.

Other Exemplary Embodiments

As described above, the first exemplary embodiment is explained as an illustration of a technique in the present disclosure. However, the technique in the present disclosure is not limited to this first exemplary embodiment, and is also applicable to exemplary embodiments that are appropriately changed, replaced, added, omitted, or the like.

Therefore, other exemplary embodiments are described below.

In the first exemplary embodiment, second unit 200 has input unit 300, socket 400, and hinge 500. However, a second unit is not limited to second unit 200. For example, the technique is also applicable to a case where a second unit does not have a hinge and a socket. Specifically, the second unit is an input unit having a keyboard, and the input unit includes a receiving part capable of mounting lower side 100S of first unit 100 on a principal surface provided with the keyboard. A predetermined surface of the second unit may be a surface of the receiving part that faces lower side 100S of first unit 100 when lower side 100S of first unit 100 is mounted on the receiving part. For example, the predetermined surface may be an upper surface (a principal surface provided with an input part, such as the keyboard) of the second unit. In this case, a drive mechanism may be housed in an internal space of the input unit.

As above, the exemplary embodiments are described as the illustration of the technique in the present disclosure. For that purpose, the attached drawings and the detailed description are provided.

Therefore, the components mentioned in the attached drawings and the detailed description may include not only components that are essential for solving the problems, but also components that are not essential for solving the problems to illustrate the technique. Accordingly, those nonessential components should not be immediately recognized as essential just because those nonessential components are mentioned in the attached drawings or the detailed description.

Further, since the aforementioned exemplary embodiments illustrate the technique in the present disclosure, various changes, replacements, additions, omissions, or the like can be made in the claims and their equivalents.

The present disclosure can be widely used in an electronic device including a first unit and a second unit and being constructed such that the first unit and the second unit are detachable.

What is claimed is:

1. An electronic device comprising:
a first unit having a first electronic member; and
a second unit having a second electronic member, the electronic device being constructed such that the first unit and the second unit are detachable,
wherein
the first unit has a first engageable part and a second engageable part provided separately,
the second unit has a lock mechanism capable of locking the first unit in a state where the first unit is attached to the second unit,
the lock mechanism includes:
an operating member movable between a first position and a second position;
a first engaging member engageable with the first engageable part and movable;
a second engaging member engageable with the second engageable part and movable; and
a drive mechanism configured to engage the first engaging member and the first engageable part and the second engaging member and the second engageable part when the operating member is located at the first position, and configured to release engagement between the first engaging member and the first engageable part and engagement between the second engaging member and the second engageable part when the operating member is located at the second position, and
each of the first engaging member and the second engaging member is provided in the second unit so as to protrude to outside from a predetermined surface of the second unit, and is rotatable around a rotating axial center perpendicular to the predetermined surface,
each of the first engageable part and the second engageable part is provided on a predetermined side of the first unit, and is formed such that the first engageable part and the second engageable part are respectively engaged with the first engaging member and the second engaging member when each of the first engaging member and the second engaging member is located at a first rotational position, and are respectively disengaged from the first engaging member and the second engaging member when each of the first engaging member and the second engaging member is located at a second rotational position,
the operating member is linearly movable between the first position and the second position in a predetermined direction,
the drive mechanism further has:
a first spring configured to bias the operating member toward the first position in the predetermined direction,
the drive mechanism converts the linear movement of the operating member between the first position and the second position into rotation of each of the first engaging member and the second engaging member between the first rotational position and the second rotational position, such that each of the first engaging member and the second engaging member is rotated to the first rotational position when the operating member is moved to the first position, and that each of the first engaging member and the second engaging member is rotated to the second rotational position when the operating member is moved to the second position,
each of the first engaging member and the second engaging member has an engaging projection that protrudes in a direction perpendicular to the rotating axial center,
each of the first engageable part and the second engageable part has an engagement recess, the engagement recess being engaged with the corresponding engaging projection when each of the first engaging member and the second engaging member is located at the first rotational position, and being disengaged from the corresponding engaging projection when each of the first engaging member and the second engaging member is located at the second rotational position,
each of the first engaging member and the second engaging member is configured to be movable between a first axial center direction position and a second axial center direction position in a rotating axial center direction along the rotating axial center of each of the first engaging member and the second engaging member, each of the first engaging member and the second engaging member further has a fitting projection at a predetermined position in the rotating axial center direction, the fitting projection is fitted into a corresponding predetermined recess of the second unit and regulates rotation of the first engaging member and the second engaging member when each of the first engaging member and the second engaging member is located at the second axial center direction position and at the second rotational position, and the fitting projection releases the fitting into the corresponding predetermined recess and allows rotation of the corresponding one of the first engaging member and the second engaging member when each of the first engaging member and the second engaging member is located at the first axial center direction position.

2. The electronic device according to claim 1, wherein the drive mechanism further has:

a second biasing member configured to bias each of the first engaging member and the second engaging member to the second axial center direction position in the rotating axial center direction by corresponding to each of the first engaging member and the second engaging member, and when the first unit is attached to the second unit, a predetermined area of each of the first engaging member and the second engaging member abuts on a predetermined area of each of the first engageable part and the second engageable part of the first unit, and each of the first engaging member and the second engaging member is moved to the first axial center direction position against biasing force of the second biasing member.

3. The electronic device according to claim 2, wherein each of the first engaging member and the second engaging member is provided with an engaging shaft that extends parallel to the rotating axial center, the drive mechanism has a coupling member fixed to the operating member and supported by a predetermined casing of the second unit so as to be movable in a direction parallel to a moving direction of the operating member, the coupling member has grooves, with which the engaging shafts of the first engaging member and the second engaging member is engaged relatively movably, respectively, and each of the grooves is formed in a meandering manner, such that the corresponding one of the first engaging member and the second engaging member is rotated around the rotating axial center to the first rotational position when the operating member is moved to the first position, and that the corresponding one of the first engaging member and the second engaging member is rotated around the rotating axial center to the second rotational position when the operating member is moved to the second position.

4. The electronic device according to claim 2, wherein the second unit is provided with a third biasing member configured to bias the first unit attached to the second unit toward the second axial center direction position in the rotating axial center direction of each of the first engaging member and the second engaging member.

5. The electronic device according to claim 4, wherein the third biasing member is a connector pin for giving and receiving an electric signal and/or electric power between the second unit and the first unit.

6. The electronic device according to claim 5, wherein the second unit includes:

an input unit having a keyboard;

a socket capable of housing a predetermined side of the first unit; and a hinge that couples a predetermined side of the input unit to a predetermined side of the socket such that the input unit and the socket are relatively rotatable, and the predetermined surface of the second unit is a surface of the socket that faces the predetermined side of the first unit when the predetermined side of the first unit is housed in the socket.

7. The electronic device according to claim 6, wherein the drive mechanism is housed in an internal space of the socket.

8. The electronic device according to claim 5, wherein the second unit is an input unit having a keyboard, the input unit includes a receiving part capable of mounting the predetermined side of the first unit, on a principal surface provided with the keyboard, and the predetermined surface of the second unit is a surface of the receiving part that faces the predetermined side of the first unit when the predetermined side of the first unit is mounted on the receiving part.

9. The electronic device according to claim 8, wherein the drive mechanism is housed in an internal space of the input unit.

10. An electronic device comprising:

a first unit having a first electronic member; and a second unit having a second electronic member, the electronic device being constructed such that the first unit and the second unit are detachable, wherein the first unit has a first engageable part and a second engageable part provided separately, the second unit has a lock mechanism capable of locking the first unit in a state where the first unit is attached to the second unit, the lock mechanism includes:

an operating member moveable between a first position and a second position;

a first engaging member engageable with the first engageable part and movable;

a second engaging member engageable with the second engageable part and movable; and a drive mechanism configured to engage the first engaging member and the first engageable part and the second engaging member and the second engageable part when the operating member is located at the first position, and configured to release engagement between the first engaging member and the first engageable part and engagement between the second engaging member and the second engageable part when the operating member is located at the second position, and each of the first engaging member and the second engaging member is provided in the second unit so as to protrude to outside from a predetermined surface of the second unit, and is rotatable around a rotating axial center perpendicular to the predetermined surface, each of the first engageable part and the second engageable part is provided on a predetermined side of the first unit, and is formed such that the first engageable part and the second engageable part are respectively engaged with the first engaging member and the second engaging member when each of the first engaging member and the second engaging member is located at a first rotational position, and are respectively disengaged from the first engaging member and the second engaging member when each of the first engaging member and the second engaging member is located at a second rotational position, the operating member is linearly movable between the first position and the second position in a predetermined direction, the drive mechanism further has:
- a first spring configured to bias the operating member toward the first position in the predetermined direction, the drive mechanism converts the linear movement of the operating member between the first position and the second position into rotation of each of the first engaging member and the second engaging member between the first rotational position and the second rotational position, such that each of the first engaging member and the second engaging member is rotated to the first rotational position when the operating member is moved to the first position, and that each of the first engaging member and the second engaging member is rotated to the second rotational position when the operating member is moved to the second position, each of the first engaging member and the second engaging member has an engaging projection that protrudes in a direction perpendicular to the rotating axial center, each of the first engageable part and the second engageable part has an engagement recess, the engagement recess being engaged with the corresponding engaging projection when each of the first engaging member and the second engaging member is located at the first rotational position, and being disengaged from the corresponding engaging projection when each of the first engaging member and the second engaging member is located at the second rotational position, each of the first engaging member and the second engaging member is configured to be movable between a first axial center direction position and a second axial center direction position in a rotating axial center direction along the rotating axial center of each of the first engaging member and the second engaging member, each of the first engaging member and the second engaging member further has a fitting projection at a predetermined position in the rotating axial center direction, the fitting projection is fitted into a corresponding predetermined recess of the second unit and regulates rotation of the first engaging member and the second engaging member when each of the first engaging member and the second engaging member is located at the second axial center direction position and at the second rotational position, and the fitting projection releases the fitting into the corresponding predetermined recess and allows rotation of the corresponding one of the first engaging member and the second engaging member when each of the first engaging member and the second engaging member is located at the first axial center direction position, and the first unit is a tablet type computer.

* * * * *